United States Patent
Kubota et al.

(10) Patent No.: US 9,887,347 B2
(45) Date of Patent: Feb. 6, 2018

(54) PIEZOELECTRIC ELEMENT, PIEZOELECTRIC ACTUATOR AND ELECTRONIC INSTRUMENT USING THE SAME

(71) Applicant: CANON KABUSHIKI KAISHA, Tokyo (JP)

(72) Inventors: Makoto Kubota, Yokohama (JP); Takanori Matsuda, Chofu (JP); Kaoru Miura, Matsudo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/354,319

(22) Filed: Nov. 17, 2016

(65) Prior Publication Data

US 2017/0155036 A1    Jun. 1, 2017

(30) Foreign Application Priority Data

Nov. 27, 2015   (JP) .................................. 2015-231426

(51) Int. Cl.
*B41J 2/045* (2006.01)
*H01L 41/187* (2006.01)
(Continued)

(52) U.S. Cl.
CPC ............ *H01L 41/1871* (2013.01); *B06B 1/06* (2013.01); *B06B 1/0644* (2013.01); *B41J 2/14233* (2013.01); *G02B 26/02* (2013.01); *G02B 26/08* (2013.01); *H01L 41/047* (2013.01); *H01L 41/0471* (2013.01); *H01L 41/0815* (2013.01); *H01L 41/09* (2013.01); *H01L 41/0973* (2013.01); *H02N 2/103* (2013.01);

(Continued)

(58) Field of Classification Search
CPC .............. H01L 41/1878; H01L 41/187; H01L 41/1871; H01L 41/1876; H01L 21/31691; B41J 2/14233; B41J 2/161; B41J 2/14274; B41J 2/1612; B41J 2202/03
USPC ................................ 347/68, 70–72; 29/25.35
See application file for complete search history.

(56) References Cited

U.S. PATENT DOCUMENTS 7,033,521 B2    4/2006   Iwashita et al.
8,529,785 B2    9/2013   Kubota et al.
(Continued)

FOREIGN PATENT DOCUMENTS

JP    2011-243722 A    12/2011

OTHER PUBLICATIONS

Matsuda et al., U.S. Appl. No. 15/354,297, filed Nov. 17, 2016.
(Continued)

*Primary Examiner* — An Do
(74) *Attorney, Agent, or Firm* — Fitzpatrick, Cella, Harper & Scinto

(57) ABSTRACT

A piezoelectric element includes a substrate, a first electrode, a piezoelectric film and a second electrode that are sequentially placed in the above-mentioned order. The piezoelectric film contains oxides of Ba, Bi, Ti, Zr, Fe and Mn and has a perovskite structure, wherein the molar ratio y of Bi relative to the sum of Ba and Bi is $0.001 \leq y \leq 0.015$, the molar ratio x of Zr relative to the sum of Ti, Zr, Fe and Mn is $0.010 \leq x \leq 0.060$, the molar ratio z of Fe relative to the sum of Ti, Zr, Fe and Mn is $0.001 \leq z \leq 0.015$, and the molar ratio m of Mn relative to the sum of Ti, Zr, Fe and Mn is $0.0020 \leq m \leq 0.0150$, while the relationship between y and z is expressed by $0.90 \leq y/z \leq 1.10$.

31 Claims, 11 Drawing Sheets

(51) Int. Cl.

| | | |
|---|---|---|
| *B06B 1/06* | (2006.01) | |
| *B41J 2/14* | (2006.01) | |
| *H01L 41/047* | (2006.01) | |
| *H01L 41/08* | (2006.01) | |
| *H01L 41/09* | (2006.01) | |
| *H02N 2/18* | (2006.01) | |
| *H03H 9/64* | (2006.01) | |
| *G02B 26/02* | (2006.01) | |
| *G02B 26/08* | (2006.01) | |
| *H02N 2/10* | (2006.01) | |
| *H02N 2/16* | (2006.01) | |
| *H01L 41/316* | (2013.01) | |
| *H01L 41/318* | (2013.01) | |
| *H03H 9/02* | (2006.01) | |

(52) U.S. Cl.
CPC ............... *H02N 2/16* (2013.01); *H02N 2/186* (2013.01); *H03H 9/64* (2013.01); *B41J 2202/03* (2013.01); *H01L 41/316* (2013.01); *H01L 41/318* (2013.01); *H03H 9/02015* (2013.01); *H03H 9/02543* (2013.01)

(56) References Cited

U.S. PATENT DOCUMENTS

| | | |
|---|---|---|
| 8,547,001 B2 | 10/2013 | Saito et al. |
| 8,980,117 B2 | 3/2015 | Kubota et al. |
| 9,022,531 B2 | 5/2015 | Kubota et al. |
| 9,022,534 B2 | 5/2015 | Yabuta et al. |
| 9,082,975 B2 | 7/2015 | Kubota et al. |
| 9,082,976 B2 | 7/2015 | Kubota et al. |
| 9,231,188 B2 | 1/2016 | Suzuki et al. |
| 9,252,685 B2 | 2/2016 | Ifuku et al. |
| 9,306,149 B2 | 4/2016 | Hayashi et al. |
| 2016/0104833 A1 | 4/2016 | Suzuki et al. |
| 2016/0204336 A1 | 7/2016 | Shimizu et al. |

OTHER PUBLICATIONS

Matsuda et al., U.S. Appl. No. 15/354,277, filed Nov. 17, 2016.
Kubota et al., U.S. Appl. No. 15/354,349, filed Nov. 17, 2016.
Saburo Nagakura et al. (ed.), Iwanami Physicochemical Dictionary, Fifth Edition, pp. 1-3 (Iwanami Shoten, Publishers; Feb. 1998) (English language translation).
Non-final Office Action in U.S. Appl. No. 15/354,349 (dated Jul. 10, 2017).

PIEZOELECTRIC ELEMENT, PIEZOELECTRIC ACTUATOR AND ELECTRONIC INSTRUMENT USING THE SAME

BACKGROUND OF THE INVENTION

Field of the Invention

The present invention relates to a thin film piezoelectric element that substantially does not contain lead. The present invention also relates to a piezoelectric actuator, a liquid ejection head, a liquid ejection device, a vibration correction mechanism, a variable optical component, a movable optical component, an optical instrument, an imaging device, an optical switch, a micromirror device, an ultrasonic probe, an ultrasonic inspection device, an acoustic component, an angular velocity sensor, a vibration power generation device, a surface acoustic wave generating device, a piezoelectric shutter and an electronic instrument.

Description of the Related Art

A thin film piezoelectric element normally comprises a lower electrode, an upper electrode and a piezoelectric film sandwiched between the electrodes. A piezoelectric film is formed by a polycrystalline substance prepared from a ferroelectric metal oxide. A piezoelectric film generally contains as principal ingredient $ABO_3$ type perovskite-type metal oxide such as lead zirconate titanate (PZT). However, since PZT contains lead as A-site element, its adverse influence on the environment is regarded as a problem that needs to be dissolved. For this reason, there is a demand for piezoelectric film containing no lead (lead-free piezoelectric film).

Barium zirconate titanate film is known as lead-free piezoelectric film. Japanese Patent Application Laid-Open No. 2011-243722 describes an achievement of suppressing cracks of piezoelectric film by adding manganese oxide to barium zirconate titanate by not less than 2 mol % and not more than 4 mol % relative to the sum of titanium and zirconium. However, the piezoelectric performance of the disclosed composition shows a peak at and around room temperature. Therefore, in applications where the operating temperature is assumed to be between about −30° C. and 50° C., there arises a problem of an insufficient piezoelectric constant at low and high temperatures and also a problem of a large dielectric loss at any operating temperature.

SUMMARY OF THE INVENTION

Therefore, the object of the present invention is to solve the above identified problem and provide a thin film piezoelectric element whose piezoelectric film portion has a high Curie temperature and that shows both a high and stable piezoelectric constant and a small dielectric loss within the temperature range between −30° C. and 50° C.

The present invention also provides a piezoelectric actuator, a liquid ejection head, a liquid ejection device, a vibration correction mechanism, a variable optical component, a movable optical component, an optical instrument, an imaging device, an optical switch, a micromirror device, an ultrasonic probe, an ultrasonic inspection device, an acoustic component, an angular velocity sensor, a vibration power generation device, a surface acoustic wave generating device, a piezoelectric shutter and an electronic instrument.

A piezoelectric element according to the present invention comprises: a substrate; a first electrode; a piezoelectric film; and a second electrode, the piezoelectric film containing oxides of Ba, Bi, Ti, Zr, Fe and Mn, wherein the molar ratio y of Bi relative to the sum of Ba and Bi is $0.001 \leq y \leq 0.015$; the molar ratio x of Zr relative to the sum of Ti, Zr, Fe and Mn is $0.010 \leq x \leq 0.060$; the molar ratio z of Fe relative to the sum of Ti, Zr, Fe and Mn is $0.001 \leq z \leq 0.015$; the molar ratio m of Mn relative to the sum of Ti, Zr, Fe and Mn is $0.0020 \leq m \leq 0.0150$; and the relationship between y and z is expressed by $0.90 \leq y/z \leq 1.10$.

A piezoelectric actuator according to the present invention comprises a piezoelectric element as defined above and a vibration plate carrying the piezoelectric element arranged thereon.

A liquid ejection head according to the present invention comprises a liquid chamber provided with a vibrating portion having a piezoelectric element as defined above and an ejection port communicating with the liquid chamber.

A liquid ejection device according to the present invention comprises a mounting portion for receiving a transfer medium and a liquid ejection head as defined above.

A vibration correction mechanism according to the present invention comprises two or more than two piezoelectric actuators as defined above, the piezoelectric actuators being arranged so as to expand/contract in not less than two directions in response to an application of a voltage.

A variable optical component according to the present invention comprises a piezoelectric actuator as defined above and an optical component mechanically connected to the piezoelectric actuator and has a mechanism for causing the shape of the optical component to be changed by deformation of the piezoelectric actuator.

A movable optical component according to the present invention comprises a piezoelectric actuator as defined above and an optical component mechanically connected to the piezoelectric actuator and has a mechanism for causing the optical component to be moved and/or rotated by deformation of the piezoelectric actuator.

An optical instrument according to the present invention comprises a vibration correction mechanism as defined above and an optical component held to the vibration correction mechanism or comprises a variable optical component as defined above or a movable optical component as defined above.

An imaging device according to the present invention comprises a vibration correction mechanism as defined above and an imaging element unit held to the vibration correction mechanism.

An optical switch according to the present invention comprises a variable optical component as defined above or a movable optical component as defined above.

A micromirror device according to the present invention comprises a plurality of micromirrors and a plurality of piezoelectric actuators as defined above, the plurality of piezoelectric actuators being mechanically connected to the respective micromirrors.

An ultrasonic probe according to the present invention comprises a piezoelectric actuator as defined above and has a function of oscillating ultrasonic waves and a function of receiving reflected ultrasonic waves.

An ultrasonic inspection device according to the present invention comprises an ultrasonic probe as defined above, a signal processing unit and an image generation unit.

An acoustic component according to the present invention comprises a piezoelectric actuator as defined above and transmits or receives sounds by driving the piezoelectric actuator.

An angular velocity sensor according to the present invention comprises a piezoelectric element as defined above and transforms any change in the shape of the piezoelectric element into angular velocity information.

A vibration power generation device according to the present invention comprises a piezoelectric element as defined above and transforms vibration energy into electric energy by means of the piezoelectric element.

A surface acoustic wave generating device according to the present invention comprises a piezoelectric element as defined above and generates surface acoustic waves by means of the piezoelectric element.

A piezoelectric shutter according to the present invention comprises a surface acoustic wave generating device as defined above and a light shielding member and moves the light shielding member by driving the surface acoustic wave generating device.

An electronic instrument according to the present invention comprises an electronic component and a piezoelectric element as defined above, the piezoelectric element being arranged on the electronic component.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

A piezoelectric element according to the present invention comprises a substrate, a first electrode, a piezoelectric film and a second electrode (first embodiment) or alternatively it comprises a substrate, a piezoelectric film and a plurality of comb-shaped electrodes (second embodiment).

The piezoelectric film is an oxide film containing Ba, Bi, Ti, Zr, Fe and Mn, wherein the value of y representing the molar ratio of Bi relative to the sum of Ba and Bi is $0.001 \leq y \leq 0.015$; the value of x representing the molar ratio of Zr relative to the sum of Ti, Zr, Fe and Mn is $0.010 \leq x \leq 0.060$; the value of z representing the molar ratio of Fe relative to the sum of Ti, Zr, Fe and Mn is $0.001 \leq z \leq 0.015$; the value of m representing the molar ratio of Mn relative to the sum of Ti, Zr, Fe and Mn is $0.0020 \leq m \leq 0.0150$; and the relationship between y and z is expressed by $0.90 \leq y/z \leq 1.10$.

The general formula (1) as shown below is the chemical formula of the perovskite-type metal oxide, which is the principal ingredient of the piezoelectric film.

$$(Ba_{1-y}Bi_y)(Ti_{1-x-z-m}Zr_zFe_xMn_m)O_3 \quad (1),$$

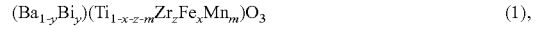

where x, y, z, y/z and m are respectively defined as $0.010 \leq x \leq 0.060$, $0.001 \leq y \leq 0.015$, $0.001 \leq z \leq 0.015$, $0.90 \leq y/z \leq 1.10$ and $0.0020 \leq m \leq 0.0150$.

(Configuration of Piezoelectric Element)

Figure 1A:
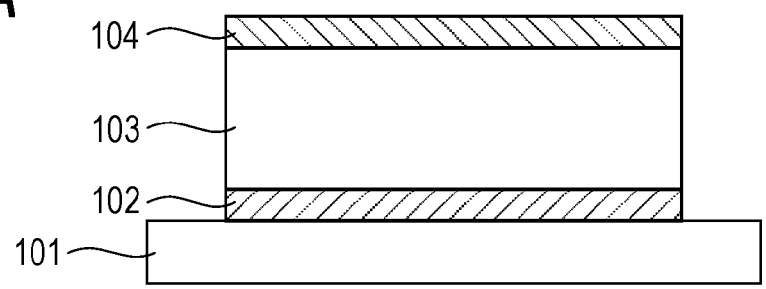
FIGS. 1A, 1B and 1C are schematic cross sectional views of the first embodiment of piezoelectric element according to the present invention, showing an exemplary configuration thereof.
Figure 1B:
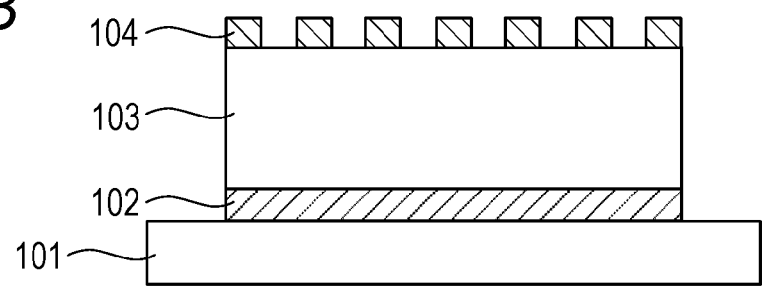
Figure 1C:
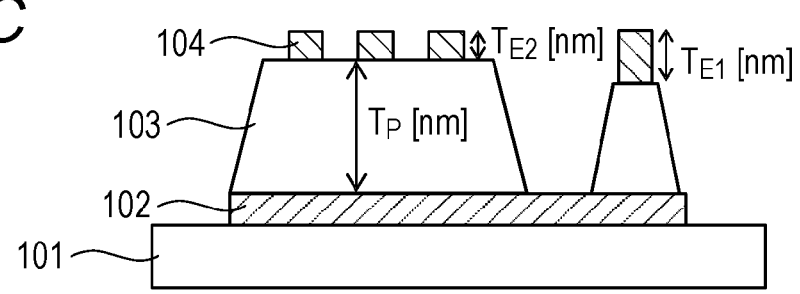
Figure 2A:
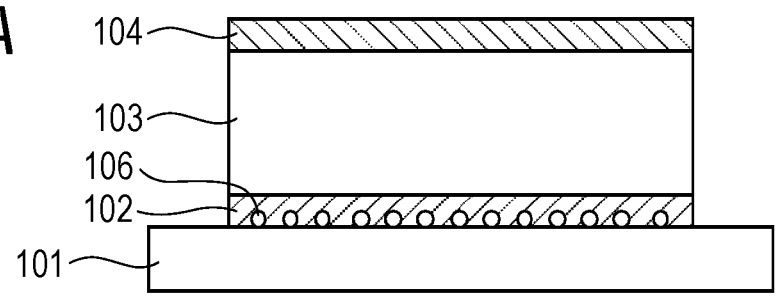
FIGS. 2A, 2B and 2C are schematic cross sectional views of the first embodiment of piezoelectric element according to the present invention, showing another exemplary configuration thereof.
Figure 2B:
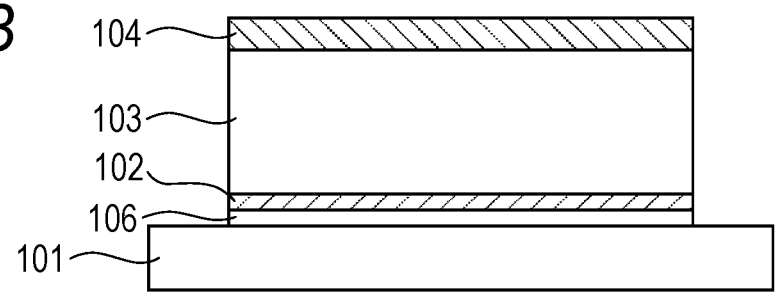

FIGS. 1A through 1C are schematic cross sectional views of the first embodiment of piezoelectric element according to the present invention, showing an exemplary configuration thereof. The first embodiment of piezoelectric element of the present invention has a configuration realized by arranging a substrate 101, a first electrode 102, a piezoelectric film 103 and a second electrode 104. In the first embodiment shown in FIG. 1A, all of the first electrode 102, the piezoelectric film 103 and the second electrode 104 have the same area and all the edge surfaces of them are vertically aligned in the direction perpendicular to the surface of the substrate 101. However, the configuration of the first embodiment is by no means limited to the one illustrated in FIG. 1A. As seen from FIGS. 1B and 1C, each of the constituting parts may freely be modified in terms of area and shape according to the application thereof, or one or more than one additional constituting members may be arranged between them, so long as the arrangement of such additional members does not impair the function of the piezoelectric element as a whole. Examples of additional members that can be used for a piezoelectric element according to the present invention include one or more than one adhesion components 106 for enhancing the adhesiveness between the individual constituting parts and one or more than one buffer components for improving the crystallinity and the orientation of each of the constituting parts as shown in FIGS. 2A and 2B.

Figure 15A:
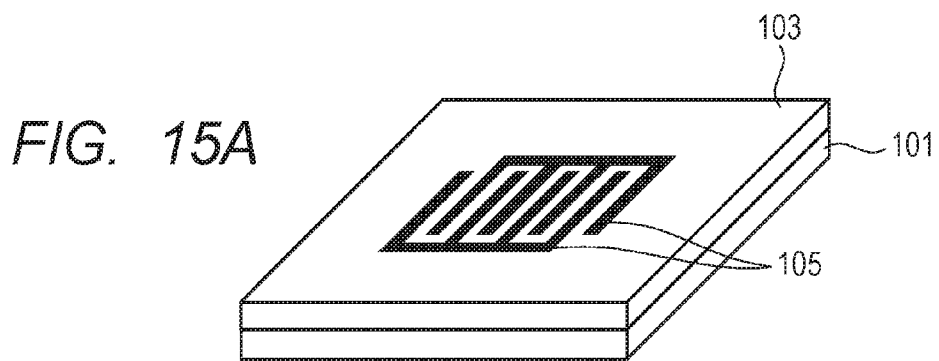
FIGS. 15A, 15B, 15C and 15D are schematic views of the second embodiment of piezoelectric element according to the present invention, a surface acoustic wave generating device and a piezoelectric shutter according to the present invention, respectively showing exemplary configurations thereof.

FIG. 15A is a schematic cross sectional view of the second embodiment of piezoelectric element according to the present invention, showing an exemplary configuration thereof. The second embodiment of piezoelectric element according to the present invention has a configuration realized by arranging a substrate 101, a piezoelectric film 103 and a plurality of comb-shaped electrodes 105. So long as the number of the comb-shaped electrodes 105 is not less than two, the arrangement of the comb-shaped electrodes 105 is not limited to the one illustrated in FIG. 15A, although it is preferable that the number of the electrodes is a multiple of two and the pair or each pair of them are interdigitally arranged as shown in FIG. 15A. The substrate 101 and the piezoelectric film 103 may or may not be patterned.

(Substrate)

While the material of the substrate 101 is not subjected to any limitations, it is preferably a material that is neither deformed nor molten in the heating process where the first electrode 102, the piezoelectric film 103 and the second electrode 104 are arranged on the substrate. The highest temperature of the heating process is normally not higher than 800° C. Examples of preferable substrates that can be used for the purpose of the present invention include single crystal substrates of magnesium oxide (MgO), strontium titanate ($SrTiO_3$), lanthanum aluminate ($LaAlO_3$) and so on, ceramic substrates of zirconia ($ZrO_2$), alumina ($Al_2O_3$), silica ($SiO_2$) and so on, semiconductor substrates of silicon (Si), tungsten (W) and so on, and substrates of heat-resistant stainless steel (SUS). Two or more than two of such materials as listed above may be combined for use and two or more than two substrates may be laid one on the other to form a multilayered substrate structure.

When the piezoelectric film 103 is selectively oriented in the perpendicular direction relative to the surface of the substrate 101, the underlying layers including the substrate 101 and the first electrode 102 are preferably oriented in a similar manner. If such is the case, a single crystal substrate is preferably employed for the substrate 101.

(Electrodes)

As a piezoelectric element according to the present invention comprises a pair of electrodes, the piezoelectric film 103 can be made to produce piezoelectric strain by applying a voltage to the piezoelectric film 103 and an electric signal that corresponds to the strain of the piezoelectric film 103 can be drawn out. The material of the electrodes is not subjected to any particular limitations and any material that can normally be used for electrodes can also be used for the electrodes of a piezoelectric element according to the present invention. Examples of such materials include metals such as Ti, Pt, Ta, Ir, Sr, In, Sn, Au, Al, Fe, Cr, Ni, Pd, Ag, Cu and Ru and compounds of these metals. The use of metal electrodes of Ti, Pt, Au or Ru is particularly preferable.

The first electrode 102, the second electrode 104 and the comb-shaped electrodes 105 may be made of a material selected from the above listed ones which may be formed as a laminated structure by laying two or more than two of those materials one on the other. Additionally, the first electrode 102 and the second electrode 104 may be made of respective materials that are different from each other.

The method of manufacturing the first electrode 102, the second electrode 103 and the comb-shaped electrodes 105 is not subjected to any particular limitations, although an electrode thin film having a high density and an excellent electro-conductivity can be obtained by using a technique selected from sputtering, vapor deposition and CSD (chemical solution deposition). The electrodes may be patterned to make them show a desired shape.

The electrode width and the electrode pitch of the comb-shaped electrodes 105 are not subjected to any particular limitations and can be selected so as to match the properties of the surface acoustic waves to be oscillated by excitation. However, it is suited for excited oscillations of surface acoustic waves that both the electrode width and the electrode pitch are not less than 10 μm and not more than 500 μm.

(Piezoelectric Film)

For the purpose of the present invention, a piezoelectric film refers to a thin film-shaped crystal aggregate that shows a piezoelectric effect or an inverse piezoelectric effect. A thin film is a texture arranged so as to cover one or both of the surfaces of a flat-shaped base member (substrate) and to be brought into tight contact with the latter. As shown in FIG. 1A, an electrode layer such as a first electrode 102 or an adjustment layer may be arranged between the substrate 101 and the piezoelectric film 103. The piezoelectric film 103 may directly cover the surface of the substrate 101 as shown in FIG. 15A. As far as the present invention is concerned, a film that has a film thickness, or the thickness that the film shows when it is measured in the direction perpendicular to the plane where it is arranged, of less than 10 μm and in which the number of crystal grains as counted in the above defined perpendicular direction is not more than 20 is referred to as thin film. A so-called piezoelectric ceramic product obtained by baking a metal oxide so as to produce a molded independent object differs from the piezoelectric film of a piezoelectric element according to the present invention and hence is not within the scope of the present invention.

Unlike a piezoelectric ceramic product that is independent from a substrate, the piezoelectric film is held in tight contact with the substrate and hence is bound by the substrate. Compressive stress or tensile stress arises in the inside of the piezoelectric film that is bound by the substrate in directions running along the film surface. Therefore, the piezoelectric film of a piezoelectric element according to the present invention has residual stress in a direction parallel with the surface of the substrate. This residual stress suppresses any change in the crystal structure of the piezoelectric film that arises in response to a change in the external environmental temperature. Then, as a result, the Curie temperature of the piezoelectric film becomes higher than a piezoelectric ceramic product having the same composition as that of the piezoelectric film and hence the actual operating temperature range is expanded toward the high temperature side.

Note that the internal residual stress of the piezoelectric film is generated along the surface thereof that is held in tight contact with the substrate and therefore the internal residual stress is reduced as the film thickness is increased.

For example, when the thickness of the piezoelectric film is greater than 10 μm, any effect of raising the Curie temperature due to the internal residual stress can no longer be expected.

Adaptability to microprocessing is another advantage of a piezoelectric film over piezoelectric ceramic products. A piezoelectric film having a thickness less than 10 μm can be processed to make it show a micropattern by means of a patterning operation during the film forming process or by means of an etching operation after the film forming process.

(Perovskite-Type Metal Oxide)

For the purpose of the present invention, a perovskite-type metal oxide refers to a metal oxide having a perovskite structure, which is ideally a cubic crystal structure, as defined in Iwanami Dictionary of Physics and Chemistry, Ver. 5 (Iwanami Shoten Publishers, published on Feb. 20, 1998). Metal oxides having a perovskite structure are generally expressed by the chemical formula of $ABO_3$. In a perovskite-type metal oxide, element A and element B take an ionic form and occupy specific respective positions in a unit lattice that are referred to respectively as A-site and B-site. For example, in the case of a unit lattice of a cubic crystal system, element A is located at the vertexes of the cube and element B is located at the body center of the cube. Element O takes the form of oxygen anion and is located at the face centers of the cube.

A metal oxide expressed by the general formula (1) means that the metal elements located at A-sites are Ba and Bi and metal elements located at B-sites are Ti, Zr and Fe. Note, however, that some of the elements Ba and Bi may be located at B-sites and, similarly, some of the elements Ti, Zr and Fe may be located at A-sites.

When the molar ratio of the elements at B-sites to the element O is 1:3 in a metal oxide expressed by the above describe general formula (1) and if the molar ratio is shifted slightly, for example by not less than 1%, such a shifted molar ratio is within the scope of the present invention provided that the metal oxide has a perovskite structure as its main phase.

When the molar ratio of the elements at A-sites to the elements at B-sites is 1:1 in the metal oxide expressed by the above describe general formula (1) and if the amount of the elements at A-sites shows a surplus or shortage of between −5% and 20%, such a surplus or shortage is within the scope of the present invention provided that the metal oxide has a perovskite structure as its main phase.

If the metal oxide has a perovskite structure or not can be determined by examining the piezoelectric film to see its X-ray diffraction or electron diffraction peaks. The piezoelectric film of a metal oxide having a perovskite structure as main crystal phase may auxiliary have some other crystal phases.

(Composition Ratio of Piezoelectric Film)

When the piezoelectric film of a piezoelectric element according to the present invention contains Bi and Fe within the range expressed in the general formula (1), the piezoelectric film shows an improved piezoelectric constant and a reduced dielectric loss (also referred to as dielectric tangent or tan δ) in the temperature range between −30° C. and 50° C., particularly in the low temperature range not higher than 20° C. Most of the trivalent Bi elements are located at A-sites of the perovskite skeleton while most of the trivalent Fe elements are located at B-sites. While $Bi^{3+}$ ions can position themselves both at A-sites and B-sites, since $Fe^{3+}$ ions having a relatively small ionic radius preferentially take positions at B-sites and the amount of $Fe^{3+}$ ions is substantially equal to the amount of $Bi^{3+}$ ions in a piezoelectric element according to the present invention, $Bi^{3+}$ ions consequently take positions at A-sites.

As $Bi^{3+}$ ions take positions at A-sites, the cubic crystal lattices become stabilized under the effect of the lone pairs of electrons that $Bi^{3+}$ ions have. Then, as a result, the phase transfer temperature $T_{to}$ from tetragonal crystal to orthorhombic crystal in the crystal structure of the principal ingredients of the piezoelectric film is shifted toward the low temperature side. Due to this fact, the piezoelectric constant is improved and the dielectric loss is reduced between −30° C. and 50° C. (within the drive temperature range of piezoelectric element). Particularly in the low temperature range not higher than 20° C., a remarkable effect can be obtained because the orthorhombic crystal phase that appears when Bi and Fe are non-existent is turned into a tetragonal crystal phase due to the existence of Bi and Fe.

In the above-described general formula (1), the value of x that represents the molar ratio of Zr at B-sites is within the range of $0.010 \leq x \leq 0.060$, preferably $0.030 \leq x \leq 0.060$. When the value of x is greater than 0.060, the Curie temperature falls while the high temperature resistance becomes insufficient in any application of the piezoelectric film to a piezoelectric element and the dielectric loss increases at high temperatures around 50° C. When, on the other hand, the value of x is smaller than 0.010, no satisfactory piezoelectric constant can be obtained in the temperature range between −30° C. and 50° C. in any application of the piezoelectric film to a piezoelectric element.

In the above-described general formula (1), y that represents the molar ratio of Bi at A-sites and z that represents the molar ratio of Fe at B-sites are respectively within the temperature ranges of $0.001 \leq y \leq 0.015$ and $0.001 \leq z \leq 0.015$.

When the molar ratio of either Bi or Fe falls below 0.001, no satisfactory piezoelectric constant can be obtained within the temperature range between −30° C. and 50° C., particularly in the low temperature range not higher than 20° C., in any application of the piezoelectric film to a piezoelectric element. When, on the other hand, the molar ratio of either Bi or Fe exceeds 0.015, the dielectric loss is increased in the temperature range between −30° C. and 50° C. From the viewpoint of obtaining a preferable piezoelectric constant and a preferable dielectric loss, both the molar ratio of Bi and that of Fe (the y value and the z value) are preferably not less than 0.001 and not more than 0.010. More preferably, both the content ratio of Bi and that of Fe (the y value and the z value) are not less 0.002 and not more than 0.008.

In the above-described general formula (1), the ratio of y that represents the molar ratio of Bi at A-sites to z that represents the molar ratio of Fe at B-sites, or y/z, is within the range of $0.90 \leq y/z \leq 1.10$ and ideally y/z=1. When y/z falls below 0.90, the piezoelectric constant is reduced because Fe precipitates onto grain boundaries and forms non-perovskite type auxiliary phases with other elements. When, on the other hand, y/z exceeds 1.10, the dielectric loss is increased because Bi oxide precipitates onto grain boundaries.

In the above-described general formula (1), m that represents the molar ratio of Mn at B-sites is not less than 0.0020 and not more than 0.0150.

When the piezoelectric film is made to contain Mn within the above defined range of content ratio, the piezoelectric constant of a piezoelectric element according to the present invention is found at an improved level and the dielectric loss is suppressed within the temperature range between −30° C. and 50° C. When the Mn molar ratio m is less than 0.0020, the physical properties of the piezoelectric film show little difference with those of piezoelectric film containing no Mn and hence the above-described advantages cannot satisfactorily be obtained. When, on the other hand, the Mn molar ratio m exceeds 0.0150, the dielectric loss of the piezoelectric element dramatically increases. When the dielectric loss of the piezoelectric element exceeds 1.5% (measurement frequency: 1 kHz) within the temperature range between −30° C. and 50° C., there arise problems such as heat generation that takes place while the piezoelectric element is in operation and a remarkable increase of power consumption.

The Mn contained in the piezoelectric film is not limited to metal Mn. In other words, it is sufficient for the piezoelectric film to contain Mn as ingredient. For example, Mn may exist as solid solution at B-sites or may be contained at grain boundaries. Furthermore, Mn ingredient may be contained in the piezoelectric film in the form of metal, ion, oxide, metal salt or complex. Generally, Mn can take a valence of 4+, 2+ or 3+.

The means of observing the composition of a piezoelectric film according to the present invention is not subjected to any particular limitations. Means that can be used for observing the composition include X-ray fluorometry (XRF), inductively coupled plasma atomic emission spectrometry (ICP-AES) and atomic absorption spectrometry (AAS). With any of these means, the weight ratio and the composition ratio of each of the elements contained in the piezoelectric film can be determined. Of the above-listed means, the particularly preferable one for determining the composition is XRF.

(Other Ingredients of Piezoelectric Film)

The above-described piezoelectric film may contain Ca and Sr to such an extent that commercially available materials of Ba inevitably contain, Nb to such an extent that commercially available materials of Ti inevitably contain, and Hf to such an extent that commercially available materials of Zr inevitably contain.

For the purpose of the present invention, the expression that the principal ingredients of a piezoelectric film are Ba, Bi, Ti, Zr, Fe, Mn and O means that, when the composition of the piezoelectric film is analyzed, the top seven elements in terms of abundance ratios expressed by molar quantities (numbers of atoms) are Ba, Bi, Ti, Zr, Fe, Mn and O. The piezoelectric film preferably contains Ba, Bi, Ti, Zr, Fe, Mn and O (the perovskite-type metal oxide as expressed by the general formula (1)) by not less than 98.5 mol % as sum total.

(Thickness of Piezoelectric Film)

Preferably, the maximum thickness $T_P$ of the piezoelectric film 103 in the region thereof that is sandwiched between the first electrode 102 and the second electrode 104 is not more than 10 μm. When the film is not flat, the film thickness is measured in the direction perpendicular to the surface of the substrate 101, using the surface of the substrate 101 as starting point. The preferable upper limit of the maximum film thickness $T_P$ is 5,000 nm, while the lower limit thereof is 500 nm. By defining the maximum film thickness $T_P$ to be not less than 500 nm and not more than 5,000 nm, the obtained piezoelectric film functions well and the processability of the piezoelectric film for forming an element can be secured.

More preferably, the maximum film thickness $T_P$ of the piezoelectric film 103 is not less than 700 nm and not more than 4,000 nm. Most preferably, it is not less than 1,000 nm and not more than 3,500 nm.

The maximum film thickness $T_P$ of the piezoelectric film 103 can be measured by means of a contact step meter or by microscopic observation of a cross section of the film.

FIG. 1C shows an exemplar maximum film thickness $T_P$ identified for a piezoelectric element according to the present invention and having a patterned piezoelectric film 103.

(Thickness of Electrodes)

The average value of the maximum film thickness $T_{E1}$ and the minimum film thickness $T_{E2}$ of the first electrode 102 and the second electrode 104, or $(T_{E1}+T_{E2})/2$, is preferably within the range of $0.002 \times T_P \leq (T_{E1}+T_{E2})/2 \leq 500$ nm. The maximum film thickness $T_{E1}$ and the minimum film thickness $T_{E2}$ are determined in the region where the first electrode 102 and the second electrode 104 are disposed oppositely relative to each other with the piezoelectric film sandwiched between them. In other words, if either or both of the electrodes have a dummy portion that does not participate in the function of the piezoelectric element, the film thickness of such a dummy portion is not taken into consideration. The maximum film thickness of the first electrode 102 and the maximum film thickness of the second electrode 104 are compared and the greater one is selected and specified as $T_{E1}$. Similarly, the minimum film thickness of the first electrode 102 and the minimum film thickness of the second electrode 104 are compared and the smaller one is selected and specified as $T_{E2}$. The maximum film thickness and the minimum film thickness of each of the electrodes can be measured by microscopic observation of a cross section of the electrode.

FIG. 1C shows an example where the maximum film thickness and the minimum film thickness of the second electrode 104, which is a patterned electrode, of a piezoelectric element according to the present invention are selected and specified respectively as $T_{E1}$ and $T_{E2}$. In this instance, the first electrode 102 is made of a flat film and has a uniform film thickness that is found somewhere between $T_{E1}$ and $T_{E2}$.

The lower limit of the average value $(T_{E1}+T_{E2})/2$ is $0.002 \times T_P$, which is 0.2% of the maximum film thickness $T_P$ of the piezoelectric film 103. For example, when $T_P$=5,000 nm, the lower limit of $(T_{E1}+T_{E2})/2$ is 10 nm. As far as this requirement is satisfied, the electric resistance of each of the electrodes shows a large and uniform value and does not vary as a function of the point on it so that consequently a much more uniform voltage is applied to the piezoelectric element to realize a preferable result.

The upper limit of the average value $(T_{E1}+T_{E2})/2$ is 500 nm. As far as this requirement is satisfied, the risk that the electrodes can obstruct the operation of detecting the strain generated in the piezoelectric element is reduced to realize a preferable result.

For the second embodiment of piezoelectric element according to the present invention, the average value of the maximum film thickness $T_{E1}$ and the minimum film thickness $T_{E2}$ of the comb-shaped electrodes, or $(T_{E1}+T_{E2})/2$, is preferably within the range of $0.002 \times T_P \leq (T_{E1}+T_{E2})/2 \leq 500$ nm.

(Adhesion Component)

An adhesion component containing a metal of Group IV elements and/or a metal of Group V elements is preferably interposed between the first electrode and the substrate. FIGS. 2A and 2B are schematic cross sectional views of an embodiment of piezoelectric element according to the present invention in which an adhesion component 106 is arranged between the substrate 101 and the first electrode 102. The adhesion component may be arranged as a number of spot-like pieces that are embedded in the first electrode as in the case of the adhesion component 106 shown in FIG. 2A or as a layer having a thickness of not less than 1 nm and not more than 10 nm as in the case of the adhesion component

106 shown in FIG. 2B. The material of the adhesion component 106 is preferably selected from free metals of Ti, Zr and Hf of Group IV elements, oxides thereof and nitrides thereof and/or from free metals of V, Nb and Ta of Group V elements, oxides thereof and nitrides thereof from the viewpoint of adhesiveness. All or part of the adhesion component 106 may be chemically bonded to the substrates 101 or the first electrode 102 to form an alloy or a composite oxide.

(Crystal Structure of Piezoelectric Film)

Figure 2C:
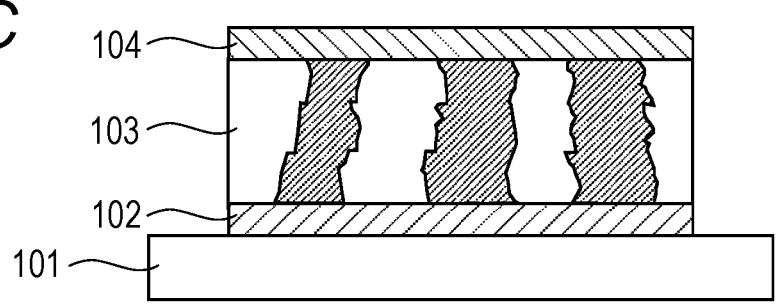

For the purpose of the present invention, a piezoelectric film refers to a thin film-shaped crystal aggregate and, preferably, the crystal aggregate has a texture formed of crystal grains having a columnar structure. FIG. 2C is a schematic cross sectional view of a piezoelectric element having a piezoelectric film 103 that has a texture produced by crystal grains having a columnar structure in the inside thereof. In FIG. 2C, both the shaded regions and the unshaded regions indicate crystal grains having a columnar structure. The fact that the crystal grains have a columnar structure can be confirmed by observing a cross section of the piezoelectric film portion of the piezoelectric element by means of a microscope. In most instances, a crystal grain having a columnar structure and a crystal grain located adjacent to the former one show different crystal orientations and hence the grain boundaries can be determined by seeing the light areas and shaded areas in the microscopic image. A texture refers to a state where two or more than two crystal grains are located adjacent to each other and, preferably, substantially all the area of a cross section of the piezoelectric film 103 shows an aggregate of columnar crystals. Ideally, a single crystal grain having a columnar structure is held in contact with both the first electrode 102 and the second electrode 104. In the instance of the second embodiment of piezoelectric element according to the present invention, a single crystal grain is preferably held in contact with both the substrate 101 and one of the comb-shaped electrodes 105.

The crystal grain diameter of the piezoelectric film 103 at the film surface is preferably not less than 300 nm and not more than 5,000 nm in terms of average circle equivalent diameter. If this requirement is satisfied, the piezoelectric constant of the piezoelectric element becomes more satisfactory in the temperature range between −30° C. and 50° C. In addition, if the crystal grain diameter is not greater than 5,000 nm, the thin film piezoelectric element shows an excellent processability. The expression of "circle equivalent diameter" refers to the expression of "projected area equivalent circle diameter" that is being popularly used in the field of microscopic observations and means the diameter of a real circle having the same area as the projected area of the crystal grain that is the target of microscopic observation. For the purpose of the present invention, the method of measuring the circle equivalent diameter is not subjected to any particular limitations. For example, the circle equivalent diameter can be determined by processing a photographic image obtained by observing the surface of the piezoelectric material that is the target of observation by means of a polarization microscope or a scanning electron microscope. Because the optimum magnification of microscope may vary as a function of the grain diameter to be observed, an optical microscope and an electron microscope may selectively be employed for the observation. The circle equivalent diameter may be determined not from the surface of the material but from an image of the polished surface or of a cross section. The expression of "average circle equivalent diameter" refers to the average value of the circle equivalent diameters of a plurality of crystal grains.

(Curie Temperature)

The Curie temperature of the piezoelectric film of a piezoelectric element according to the present invention is preferably not lower than 121° C. When the Curie temperature of the piezoelectric film is not less than 121° C., the Curie temperature can be considered as being sufficiently separated from the drive temperature range (between −30° C. and 50° C.) of the piezoelectric element. Such a Curie temperature is preferable, because in that case, even if an abrupt temperature change takes place at and near such a Curie temperature, the influence of the Curie temperature change on the piezoelectric constant and the dielectric loss of the piezoelectric element can be disregarded in the drive temperature range of the piezoelectric element. More preferable Curie temperature range is not lower than 130° C. and not higher than 195° C.

The Curie temperature is such a temperature that the piezoelectric property of the piezoelectric material in question disappears above that temperature. In this specification, the temperature at which the electrostatic capacity is maximized at or near the phase transition temperature of the ferroelectric phase (tetragonal crystal phase) and the paraelectric phase (cubic crystal phase) is referred to as Curie temperature. The electrostatic capacity can be measured, for example, by applying a micro AC electric field of a frequency of 1 kHz by means of an impedance analyzer.

(Orientation)

The crystals that form the perovskite structure of the piezoelectric film of a piezoelectric element according to the present invention are preferably selectively oriented in the direction that is perpendicular to the surface of the substrate. That is, each crystal is preferably selectively oriented in the (100) plane, the (110) plane or the (111) plane as a lattice plane of a unit lattice of a perovskite structure that is regarded as pseudo cubic crystal.

In this specification, the expression of "being selectively oriented in the (hkl) plane" refers to a state where the degree of orientation in the (hkl) plane is higher than the degree of orientation on any other plane. The expression may be paraphrased so as to read as "being preferentially oriented in the (hkl) plane". This expression includes a state of being perfectly oriented in the (hkl) plane as in the case of a single crystal.

When the piezoelectric film is oriented in the (100) plane, the (110) plane or the (111) plane, the directions of moments of polarization are aligned in the direction of the strain of the piezoelectric film to consequently raise the piezoelectric constant at each temperature.

The state of orientation of the piezoelectric film can be confirmed with ease by using the angle and the intensity of the detected diffraction peak that is observed in an X-ray diffractometry measurement (e.g., 2θ/θ method), which is a popularly employed technique in the field of crystal thin films. For example, in the diffraction chart obtained from a piezoelectric film that is oriented in one of the above listed planes, the intensity of the diffraction peak detected at the angle that corresponds to that plane is by far greater than the sum total of the intensities of the peaks detected at the angles that correspond to the remaining planes.

(Piezoelectric Film Manufacturing Method)

While the method of manufacturing a piezoelectric film 103 according to the present invention is not subjected to any particular limitations, examples of manufacturing methods that can be used for the purpose of the present invention include the CSD method, the sputtering method, the hydrothermal synthesis method, the aerosol deposition method and the MOCVD (the metal organic chemical vapor deposition) method, of which the CSD method and the sputtering method are preferable because they have the advantage of being able to excellently control the composition of the piezoelectric film to be manufactured.

As an example, the process of manufacturing a piezoelectric film 103 by means of the CSD method will be described below. The first step is a step of preparing a precursor coat liquid that contains at least Ba, Bi, Ti, Zr, Fe and Mn. An organic solvent such as alcohol is employed more often than not as the solvent to be used in the first step. The metal ingredients are made to take the form of alkoxide or nitrate before the coat liquid is forced to contain them in order to assist the dissolution or dispersion of the metal ingredients in the coat liquid. In the second step, the coat liquid is applied to the surface of the substrate 101 or the first electrode 102 by spin coating or dip coating for the purpose of film formation and then the substrate 101 or the first electrode 102 having the applied coat liquid is subjected to a heat treatment. If necessary, the second step is repeated for a plurality of times to obtain a piezoelectric film 103. Finally, a baking process may be executed in order to accelerate the crystallization.

As another example, the process of producing a piezoelectric film 103 by means of the sputtering method will be described below. The first step is a step of preparing a target material containing at least Ba, Bi, Ti, Zr, Fe and Mn. The metal ingredients may be contained in the target as a sintered body or alternatively a plurality of targets that contain the ingredient metals as isolated elements or as a mixture thereof may be provided. The second step is a step where the target or targets and the substrate 101 carrying or not carrying a first electrode 102 on the surface thereof are arranged in a chamber having a reduced pressure environment in the inside and high energy particles (such as ionized rare gas particles) are forced to collide with the surface of the target or the surfaces of the targets in order to form an intended piezoelectric film 103 on the surface of the substrate 101 or the first electrode 102. The substrate 101 may be heated in the chamber or, after forming the piezoelectric film, the piezoelectric film may be heat treated outside the chamber for the purpose of accelerating the crystallization.

(Piezoelectric Actuator)

A piezoelectric actuator according to the present invention is characterized by comprising a piezoelectric element according to the present invention and a vibration plate arranged on the piezoelectric element.

Figure 3A:
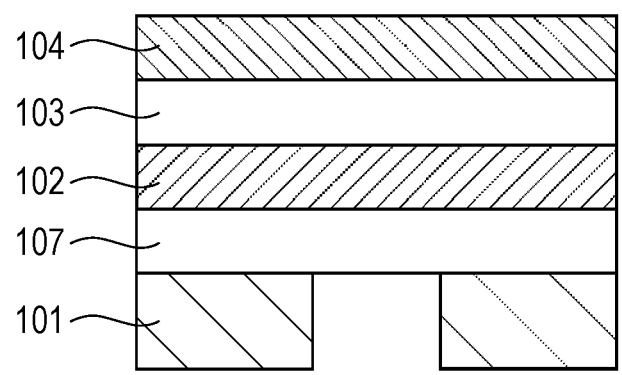
FIGS. 3A and 3B are a schematic cross sectional view and a schematic back surface view of a piezoelectric actuator according to the present invention, showing an exemplary configuration thereof.
Figure 3B:
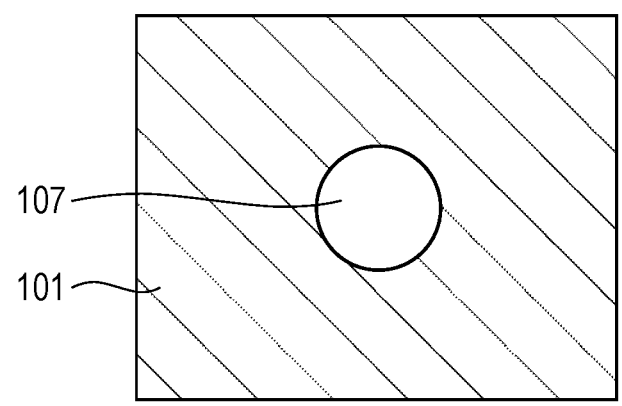

FIGS. 3A and 3B are a cross sectional view and a schematic back surface view of a piezoelectric actuator according to the present invention, showing an exemplary configuration thereof. In FIGS. 3A and 3B, the vibration plate 107 is held in contact with the first electrode 102 and the substrate 101 of a piezoelectric element according to the present invention.

The thickness of the vibration plate 107 is not less than 1.0 μm and not more than 15 μm, preferably not less than 1.5 μm and not more than 8 μm.

The material to be used for forming the vibration plate 107 is not subjected to any particular limitations. The material is typically selected from metal materials, metal oxide materials and glass-based materials. Preferable materials of the vibration plate 107 include $SiO_2$ (silicon dioxide).

There are no particular limitations to the method of manufacturing the vibration plate 107. For example, the substrate 101 may be subjected to an oxidation process in order to modify the surface thereof or a material for forming the vibration plate 107 may be bonded to the substrate 101.

The vibration plate 107 may be arranged by means of the CSD method, the sputtering method, the hydrothermal synthesis method, the aerosol deposition method or the MOCVD method. Alternatively, a surface layer portion of the substrate 101 may be made to also operate as the vibration plate 107.

When a voltage is applied between the first electrode 102 and the second electrode 104 of a piezoelectric actuator according to the present invention, the piezoelectric film 103 is deformed. Then, the deformation is amplified under the effect of the vibration plate 107 that is held in tight contact with the piezoelectric element. Then, as a result, the piezoelectric actuator having a configuration as shown in FIGS. 3A and 3B undergoes a change in the shape thereof to a large extent in the hollow cavity portion. The change (displacement) can be controlled with ease by controlling the voltage and/or the frequency that are being used.

(Liquid Ejection Head)

Now, a liquid ejection head according to the present invention will be described below.

A liquid ejection head according to the present invention comprises at least one liquid chamber provided with a vibrating portion having a piezoelectric element as defined above and an ejection port communicating with the liquid chamber.

Figure 4A:
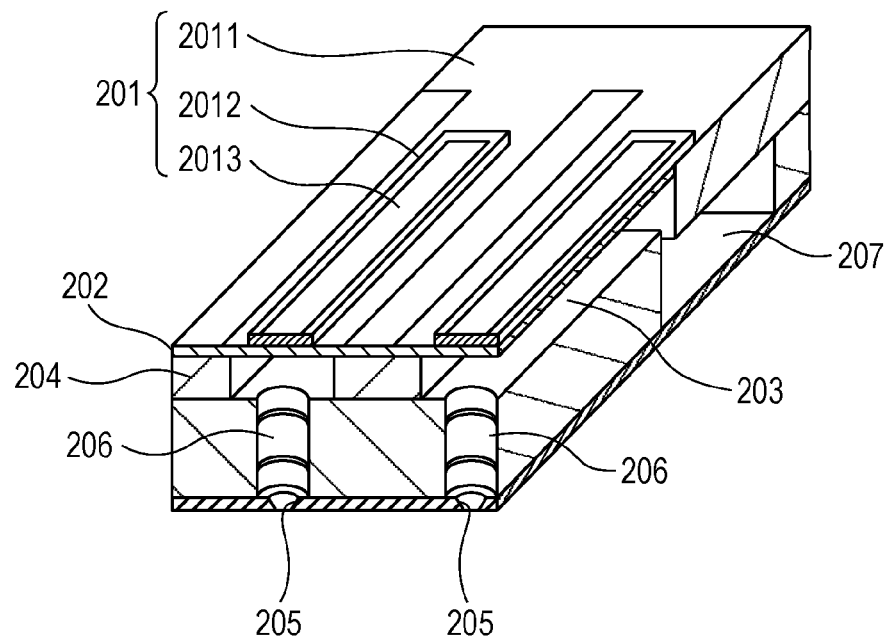
FIGS. 4A and 4B are schematic views of a liquid ejection head and a liquid ejection device according to the present invention, respectively showing exemplary configurations thereof.

FIG. 4A is a schematic view of a liquid ejection head according to the present invention, showing an exemplary configuration thereof. Note that the shape and the arrangement position of each of the constituting parts thereof are not limited to those illustrated in FIG. 4A. Each of the piezoelectric elements 201 has at least a first electrode 2011, a piezoelectric film 2012 and a second electrode 2013. In the instance of FIG. 4A, the substrate that is one of the constituting parts of the piezoelectric elements 201 according to the present invention also operates as a liquid chamber partition wall 204. The piezoelectric film 2012 and the second electrode 2013 are patterned for the purpose of raising the ejection power of the liquid ejection head. The liquid ejection head comprises ejection ports 205, individual liquid chambers 203, communication holes 206 respectively linking the individual liquid chambers 203 and the corresponding ejection ports 205, liquid chamber partition walls 204, a common liquid chamber 207, a vibration plate 202 and piezoelectric elements 201. An adhesion component may be arranged between the vibration plate 202 and the first electrodes 2011. The material and the thickness that are suitable for the vibration plate 202 are similar to those of the vibration plate 107 of the above described piezoelectric actuator.

In a liquid ejection head according to the present invention, the vibration plate 202 is vibrated to move up and down as the piezoelectric elements 201 are deformed to apply pressure to the liquid stored in each of the individual liquid chambers 203. Then, as a result, liquid is ejected from each of the ejection ports 205. A liquid ejection head according to the present invention can find an application in a printer and can be used for manufacturing an electronic instrument.

(Liquid Ejection Device)

Now, a liquid ejection device according to the present invention will be described below. A liquid ejection device according to the present invention comprises a mounting portion for receiving a transfer medium and a liquid ejection head as defined above.

Figure 4B:
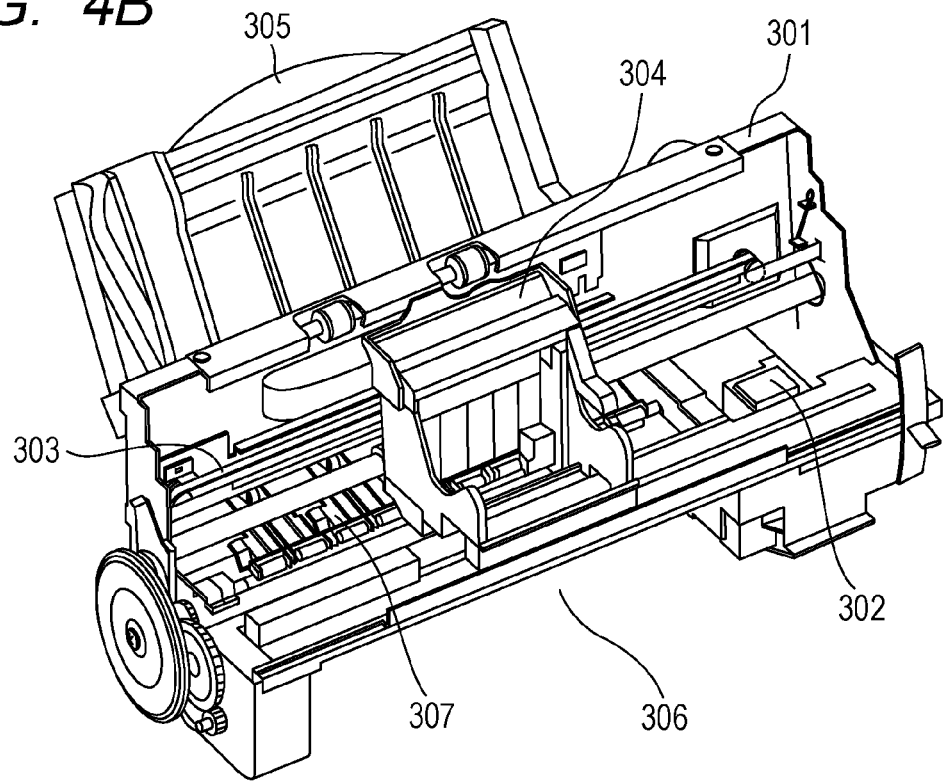

An inkjet recording device as illustrated in FIG. 4B is an example of a liquid ejection device according to the present invention. Various mechanisms are incorporated in the inside of the armoring exterior portion 301 of the inkjet recording device (liquid ejection device). Automatic feed section 305 has a function of automatically feeding a sheet of recoding paper, which is a transfer medium, into the device main body. The sheet of recording paper fed from the automatic feeding section 305 is led to a predetermined recording position (not indicated by any reference numeral in FIG. 4B) by a conveyor section 307 and, after a recording operation, led to delivery section 306 from the recording position again by the conveyor section 307. The conveyor section 307 is the mounting portion for receiving the transfer medium. The inkjet recording device additionally comprises a recording section 303 for executing a recording operation on the sheet of recording paper conveyed to the recording position and a recovery section 302 for executing a recovery process on the recording section 303. The recording section 303 stores the liquid ejection head and is provided with a carriage 304 that is driven to reciprocate the liquid ejection head on a rail.

In such an inkjet recording device as described above, a printing operation is executed as the carriage 304 moves the liquid ejection head according to the instruction transmitted from an external computer and ink is ejected from one or more than one of the ejection ports in response to the voltage or voltages applied to the piezoelectric film or films.

While a printer is described above as an example, a liquid ejection device according to the present invention can find applications in the fields of printing devices such as ink jet recording devices of facsimile machines, composite machines and copying machines as well as industrial liquid ejection apparatus and drawing apparatus for drawing images on targets. Additionally, the user of the liquid ejection device can select a desired transfer medium.

(Vibration Correction Mechanism)

Now, a vibration correction mechanism according to the present invention will be described below. A vibration correction mechanism according to the present invention is a mechanism that can reduce the influence of external vibrations on the object of conveyance by making the vibration phase of the object of conveyance inverse relative to that of the external vibrations. A vibration correction mechanism according to the present invention comprises two or more than two piezoelectric actuators according to the present invention that are arranged so as to expand/contract in not less than two directions in response to an application of a voltage.

Thus, a vibration correction mechanism according to the present invention and having the above described configuration can reduce the influence of external vibrations on the object of conveyance.

Figure 5:
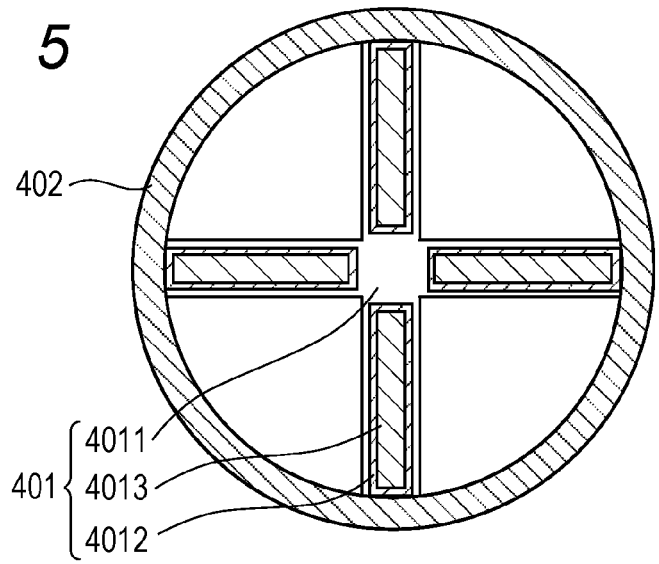
FIG. 5 is a schematic view of a vibration correction mechanism according to the present invention, showing an exemplary configuration thereof.

FIG. 5 is a schematic view of a vibration correction mechanism according to the present invention, showing an exemplary configuration thereof. Note, however, that the shape and the arrangement position of each of the constituting parts thereof are by no means limited to those illustrated in FIG. 5. A vibration correction mechanism according to the present invention comprises at least not less than two piezoelectric actuators 401 and an object of conveyance 402. Each of the piezoelectric actuators 401 has a structure formed by sequentially laying a vibration plate 4011, which also operates as substrate, a first electrode (not visible in FIG. 5 as it is hidden by a piezoelectric film), a piezoelectric film 4012 and a second electrode 4013. In FIG. 5, a plurality of piezoelectric elements are arranged on a cross-shaped common substrate and, in the specification, an expression that "the vibration correction mechanism has four piezoelectric actuators 401" is employed by referring to the number of piezoelectric elements that the vibration correction mechanism comprises. As an alternating voltage is applied to the four piezoelectric actuators 401 as shown in FIG. 5 from an external voltage source, each of the piezoelectric actuators 401 expands/contracts in the longitudinal direction of the piezoelectric film 4012 thereof. In other words, the piezoelectric actuators 401 expand/contract in two directions that are orthogonal relative to each other and transmit the vibrations to the object of conveyance 402 that is held in contact with the vibration plates 4011. The object of conveyance 402 can be made to produce a rotational motion by combining the vibrations in the two directions. Any adverse influences attributable to external vibrations can be reduced by causing the rotational motion to show a phase that is inverse relative to that of the external vibrations.

The object of conveyance 402 may be a functional member that is adversely influenced by external vibrations such as a lens, a mirror or some other optical components or a connection member that transmits vibrations to such a functional member.

(Variable Optical Component)

Now, a variable optical component according to the present invention will be described below. A variable optical component according to the present invention comprises a piezoelectric actuator as defined above and an optical component mechanically connected to the piezoelectric actuator and has a mechanism for causing the shape of the optical component to be changed by deformation of the piezoelectric actuator.

Figure 6A:
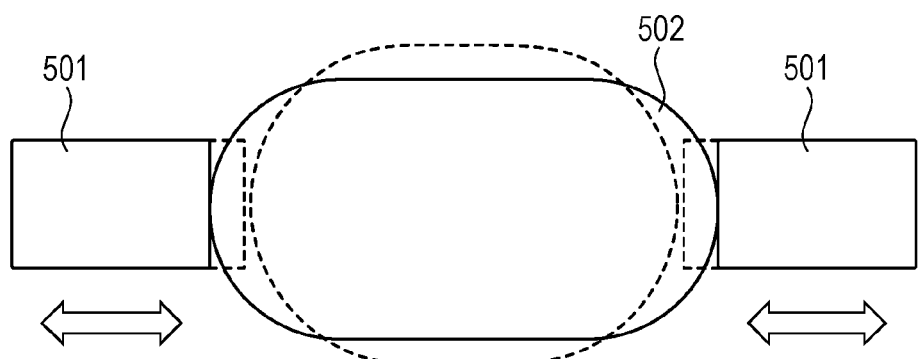
FIGS. 6A and 6B are schematic views of a variable optical component and a movable optical component according to the present invention, respectively showing exemplary configurations thereof.

FIG. 6A is a schematic view of a variable optical component according to the present invention, showing an exemplary configuration thereof. Note, however, that the shape and the position of each of the component members thereof are not limited to those illustrated in FIG. 6A. A variable optical component according to the present invention and shown in FIG. 6A comprises two piezoelectric actuators 501 and an optical component 502 whose shape is changed under the influence of a deformation of the piezoelectric actuators 501. While the piezoelectric actuators 501 and the optical component 502 are mechanically connected to each other as they are held in contact with each other in FIG. 6A, intermediate component members that have a function of transmitting a deformation of a piezoelectric actuator 501 may be interposed between the piezoelectric actuators 501 and the optical component 502. While each of the two piezoelectric actuators 501 is mechanically connected to the optical component 502 at a single position in FIG. 6A, there are no particular limitations to the number of piezoelectric actuators 501, the number of optical components 502 and also the number of connecting positions. The arrow marks in FIG. 6A are signs indicating expansions/contractions of the piezoelectric actuators 501 and they do not indicate any component members. The expression of an optical component 502 as used herein refers to a component member such as a lens, a filter or a mirror that acts on the characteristics of a light path and those of a light flux. For example, when the optical component 502 is a lens having a refractive index greater than that of air, the shape of the optical component 502 is changed in response to a deformation of the piezoelectric actuators 501 so that the angle of refraction of light passing through the lens can be controlled.

(Movable Optical Component)

Now, a movable optical component according to the present invention will be described below. A movable optical component according to the present invention comprises a piezoelectric actuator as defined above and an optical component mechanically connected to the piezoelectric actuator and has a mechanism for causing the optical component to be moved and/or rotated by deformation of the piezoelectric actuator.

Figure 6B:
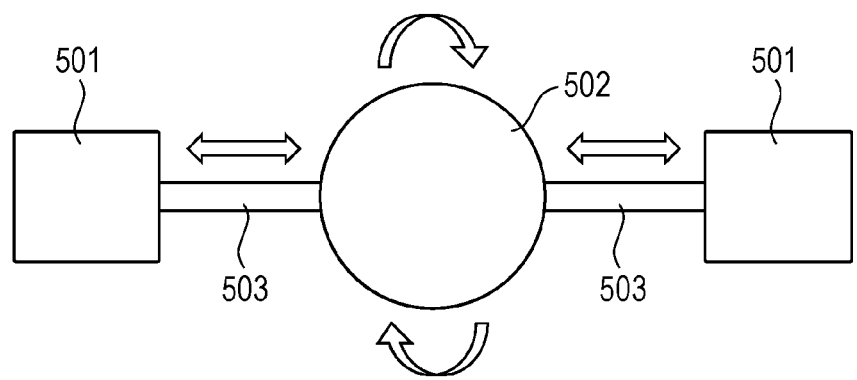

FIG. 6B is a schematic view of a movable optical component according to the present invention, showing an exemplary configuration thereof. Note, however, that the shape and the position of each of the component members thereof are not limited to those illustrated in FIG. 6B. A movable optical component according to the present invention and shown in FIG. 6B comprises piezoelectric actuators 501, an optical component 502 that is driven to move or rotate under the influence of a deformation of the piezoelectric actuators 501 and piezoelectric strain transmitting sections 503 that drive the optical component 502 to move or rotate in response to a deformation of the piezoelectric actuators 501.

While the piezoelectric actuators 501 and the optical component 502 are mechanically connected to each other as each of the piezoelectric actuators 501 and the corresponding one of the piezoelectric strain transmitting sections 503 are held in contact with each other and the piezoelectric strain transmitting sections 503 and the optical component 502 are held in contact with each other in FIG. 6B, other intermediate component members may be interposed between them. The arrow marks in FIG. 6B are signs indicating linear motions or rotational motions of the optical component 502 and they do not indicate any component members. The expression of an optical component 502 as used herein refers to a component member such as a lens, a filter or a mirror that acts on the characteristics of a light path and those of a light flux. For example, when the optical component 502 is a mirror, the coordinate values and the angle of the optical component 502 are changed in response to a deformation of the piezoelectric actuators 501 so that the direction of light reflected by the mirror can be controlled.

(Optical Instrument)

Now, an optical instrument according to the present invention will be described below.

Figure 7A:
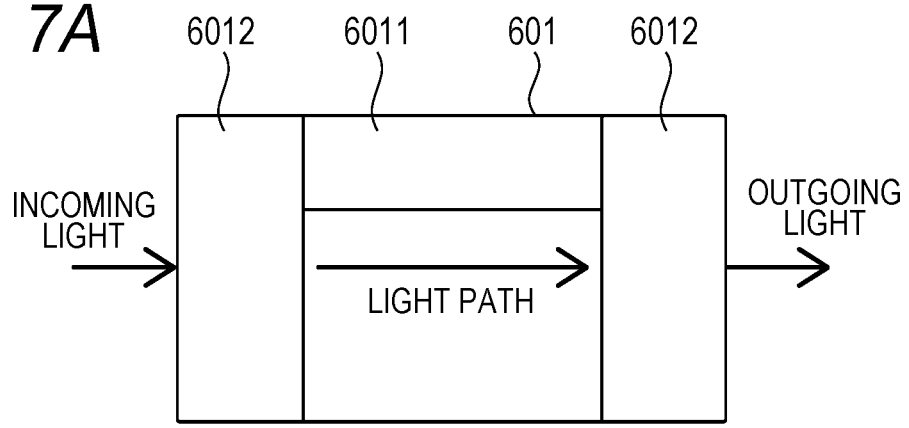
FIGS. 7A, 7B and 7C are schematic views of an optical instrument according to the present invention, respectively showing exemplary configurations thereof.

The first embodiment of optical instrument according to the present invention comprises a vibration correction mechanism as defined above and an optical component held to the vibration correction mechanism. FIG. 7A is a schematic view of the first embodiment of optical instrument according to the present invention, showing an exemplary configuration thereof. Note, however, that the number and the arrangement positions of the component members of the embodiment are not limited to those illustrated in FIG. 7A. The first embodiment of optical instrument 601 according to the present invention comprises a vibration correction mechanism 6011 and optical components 6012 that are objects of conveyance of the vibration correction mechanism 6011. An example of optical instrument according to the present invention is a lens barrel connected to an imaging device for use. When an optical instrument is such a lens barrel, the optical components 6012 are lenses. When the optical instrument that is employed as a lens barrel is subjected to external vibrations such as camera shakes, there arises a problem that the light path of the outgoing light emitted from the lens barrel changes during an exposure period of the imaging device. This problem can be solved as the vibration correction mechanism 6011 suppresses the changes of the coordinate values of the optical component 6012. As shown in FIG. 7A, the vibration correction mechanism 6011 is preferably disposed at a position where it does not interfere with the light path that passes through the optical components 6012.

Figure 7B:
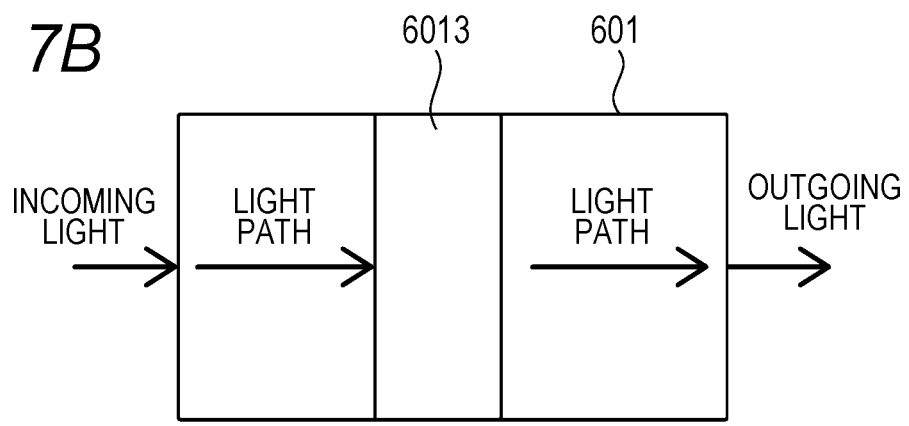

The second embodiment of optical instrument according to the present invention comprises a variable optical component as defined above. FIG. 7B is a schematic view of the second embodiment of optical instrument according to the present invention, showing an exemplary configuration thereof. This embodiment of optical instrument 601 of the present invention comprises at least a variable optical component 6013 as defined above. However, the number and the arrangement position or positions of variable optical components 6013 are not limited to those illustrated in FIG. 7B. An example of optical instrument according to the present invention is a lens barrel connected to an imaging device. If such is the case, the variable optical component 6013 or each of the variable optical components 6013 is a variable lens. When a variable lens whose light path can be controlled by means of a piezoelectric actuator, it provides an advantage of reducing the number of lenses to be used in the lens barrel. As shown in FIG. 7B, the variable optical component 6013 is preferably arranged on the light path of incoming light entering the optical instrument and the light path of outgoing light emitted from the optical instrument.

The third embodiment of optical instrument according to the present invention comprises a movable optical component as defined above.

Figure 7C:
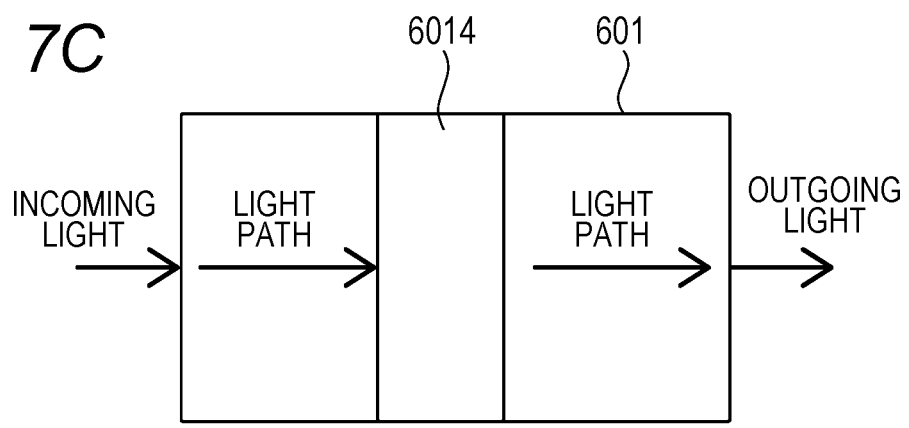

FIG. 7C is a schematic view of the third embodiment of optical instrument according to the present invention, showing an exemplary configuration thereof where the optical instrument has a movable optical component 6014. However, the number and the arrangement position or positions of movable optical components 6014 are not limited to those illustrated in FIG. 7C. An example of optical instrument according to the present invention is a lens barrel connected to an imaging device. If such is the case, the movable optical component 6014 or each of the movable optical components 6014 is a movable lens or a movable mirror. When a variable lens or a variable mirror whose light path can be controlled by means of a piezoelectric actuator, it provides an advantage of reducing the number of lenses to be used in the lens barrel. As shown in FIG. 7C, the movable optical component 6014 is preferably arranged on the light path of incoming light entering the optical instrument and the light path of outgoing light emitted from the optical instrument.

(Imaging Device)

Now, an imaging device according to the present invention will be described below.

An imaging device according to the present invention comprises a vibration correction mechanism as defined above and an imaging element unit held to the vibration correction mechanism.

Figure 8:
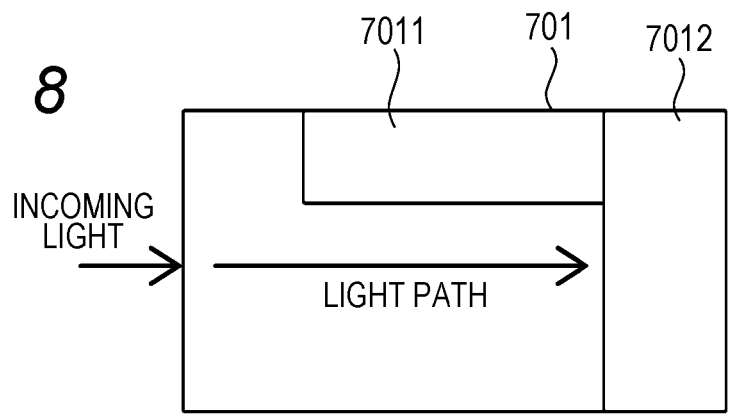
FIG. 8 is a schematic view of an imaging device according to the present invention, showing an exemplary configuration thereof.

FIG. 8 is a schematic view of an imaging device according to the present invention, showing an exemplary configuration thereof. The imaging device 701 of the present invention comprises a vibration correction mechanism 7011 and an imaging element unit 7012 that is the object of conveyance of the vibration correction mechanism 7011. An imaging element unit 7012 typically refers to a unit formed by mounting an imaging element and an electronic element on an electronic substrate. Examples of imaging element include CCD (charge-coupled device) image sensors and CMOS (complementary metal oxide semiconductor) image sensors.

When the imaging element unit 7012 is subjected to external vibrations such as shaking by hand during an exposure period, there arises a problem that the data being obtained fluctuate during the exposure period. This problem can be dissolved by suppressing the fluctuations of the coordinate values of the imaging element unit 7012 by the vibration correction mechanism 7011. The vibration correction mechanism 7011 is preferably arranged at a position where it does not interfere with the light path of the imaging element unit 7012 that extends to the light receiving plane as shown in FIG. 8.

(Optical Switch)

Now, an optical switch according to the present invention will be described below.

The first embodiment of optical switch according to the present invention comprises a variable optical component as defined above.

Figure 9A:
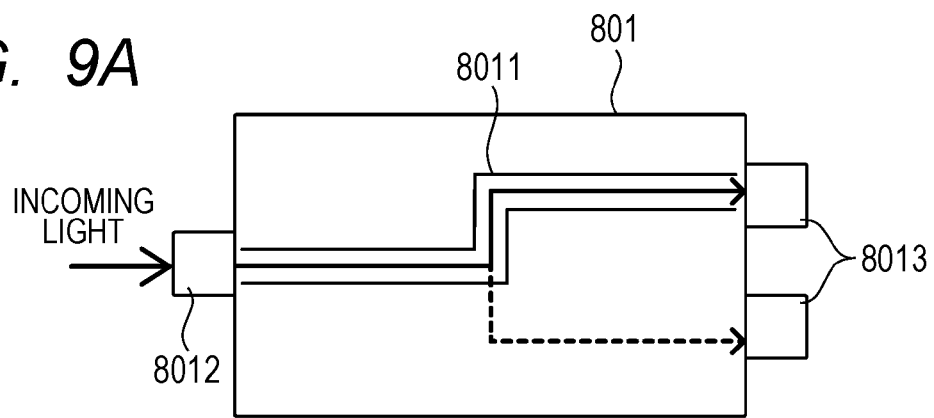
FIGS. 9A and 9B are schematic views of an optical switch according to the present invention, showing an exemplary configuration thereof.

FIG. 9A is a schematic view of the first embodiment of optical switch according to the present invention, showing an exemplary configuration thereof. Note, however, that the number, the shapes and the arrangement positions of the component members thereof are not limited to those illustrated in FIG. 9A. An optical switch 801 according to the present invention comprises a mechanism that causes the light path extending from optical signal input terminal 8012 to optical signal output terminal 8013 to be changed under the influence of a deformation of the variable optical component 8011. In the instance of FIG. 9A, the optical switch is provided with two optical signal output terminals 8013. With such an arrangement, the switch can be turned on and off by selecting either of the optical signal output terminals that light can reach by means of the variable optical component 8011. In the instance of FIG. 9A, the variable optical component 8011 has a light transmitting material such as optical fiber and a piezoelectric actuator.

The second embodiment of optical switch according to the present invention comprises a movable optical component as defined above.

Figure 9B:
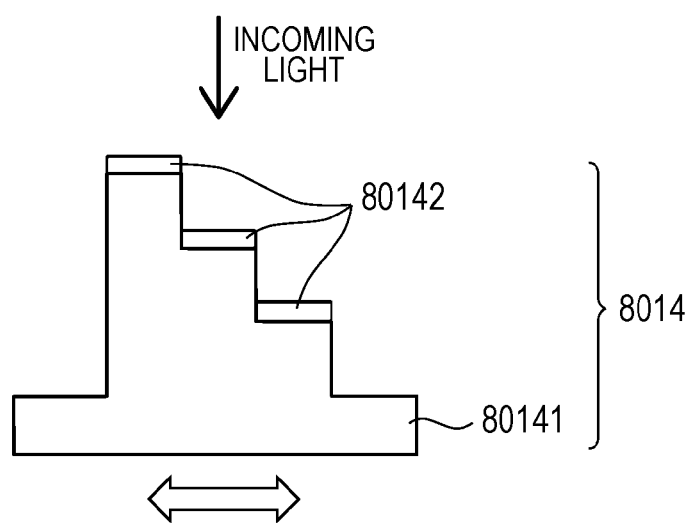

FIG. 9B is a schematic view of the second embodiment of optical switch according to the present invention, showing an exemplary configuration thereof. Note, however, that the number, the shapes and the arrangement positions of the component members thereof are not limited to those illustrated in FIG. 9B. While the movable optical component 8014 having a moving portion 80141 and reflecting portions 80142 itself operates as optical switch in the instance of FIG. 9B, alternatively, the optical switch may comprise one or more than one component members other than the movable optical component 8014 such as a slit that limits the area that incoming light can be incident on. The moving portion 80141 is a mechanism that moves toward left and right in FIG. 9B according to an instruction given from an external computer and the reflecting portions 80142 are arranged on the surfaces of the moving portion 80141 that receive incident light. The reflecting portions 80142 and the moving portion 80141 are bonded to each other so that they move together. The reflecting portions 80142 typically are mirror surfaces and have a function of emitting reflected light whose intensity varies according to the intensity of incident light. For example, when the movable optical component 8014 is driven to move left and right, the coordinate values of the reflecting portions 80142 that receive incident light are varied to in turn change the direction of reflected light. The switch can be turned on and off by utilizing the change in the direction of reflected light.

(Micromirror Device)

Now, a micromirror device according to the present invention will be described below.

Figure 10:
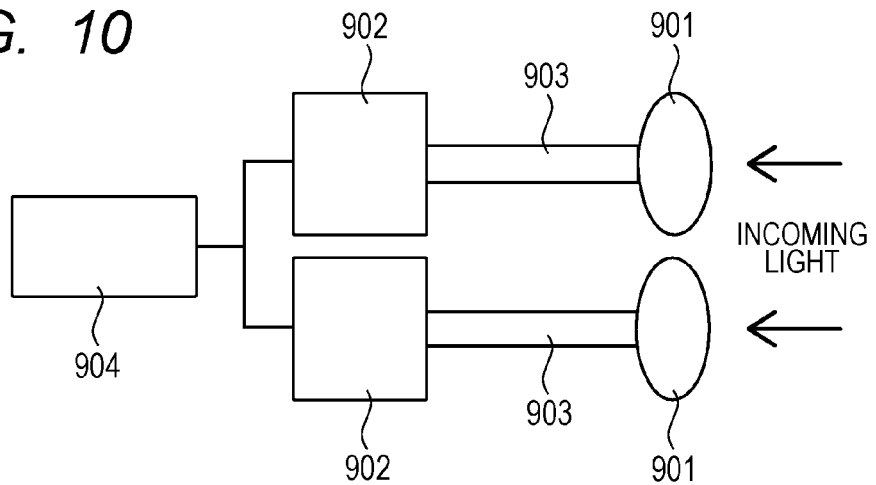
FIG. 10 is a schematic view of a micromirror device according to the present invention, showing an exemplary configuration thereof.

A micromirror device according to the present invention comprises a plurality of micromirrors and a plurality of piezoelectric actuators as defined above that are mechanically connected to the respective micromirrors. FIG. 10 is a schematic view of a micromirror device according to the present invention, showing an exemplary configuration thereof. Note, however, the number, the shapes and the arrangement positions of the component members thereof are not limited to those illustrated in FIG. 10. In the micromirror device shown in FIG. 10, each of the piezoelectric actuators 902 is deformed due to a piezoelectric effect according to an instruction given from control section 904 and piezoelectric strain transmitting section 903 adjusts the direction and the extent of the deformation of each of the piezoelectric actuators 902. As a result of these operations, each of the micromirrors 901 is driven to move and/or rotate. With the above described function, the micromirror device can reflect incoming (incident) light so as to be emitted in any desired direction.

(Ultrasonic Probe)

Now, an ultrasonic probe according to the present invention will be described below.

An ultrasonic probe according to the present invention comprises a piezoelectric actuator as defined above and has a function of oscillating ultrasonic waves and that of receiving reflected waves.

Figure 11A:
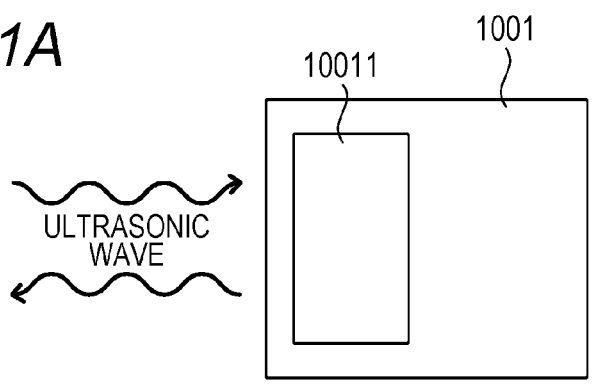
FIGS. 11A and 11B are schematic views of an ultrasonic probe and an ultrasonic inspection device according to the present invention, respectively showing exemplary configurations thereof.

FIG. 11A is a schematic view of an ultrasonic probe according to the present invention, showing an exemplary configuration thereof. Note, however, the number, the shapes and the arrangement positions of the component members thereof are not limited to those illustrated in FIG. 11A. The ultrasonic probe 1001 according to the present invention and shown in FIG. 11A contains a piezoelectric actuator 10011 and oscillates (transmits) ultrasonic waves generated due to the inverse piezoelectric effect of the piezoelectric actuator 10011. The undulating arrow marks in FIG. 11A schematically illustrate how ultrasonic waves propagate and do not indicate any component member of the ultrasonic probe 1011. The ultrasonic waves are reflected by internal tissues of a test subject and return to the ultrasonic probe as ultrasonic echoes. Information on the internal structure of the test subject can be obtained as the piezoelectric actuator 10011 transforms the vibrations attributable to the ultrasonic echoes into an electric signal.

A single piezoelectric actuator 10011 may not necessarily be made responsible for oscillations of ultrasonic waves and reception of reflected waves. In other words, two or more than two piezoelectric actuators 10011 may be employed for an ultrasonic probe according to the present invention. When two piezoelectric actuators 10011 are used, one of them may be substituted by a unit that is different from a piezoelectric actuator in the ultrasonic probe.

(Ultrasonic Inspection Device)

Now, an ultrasonic inspection device according to the present invention will be described below.

Figure 11B:
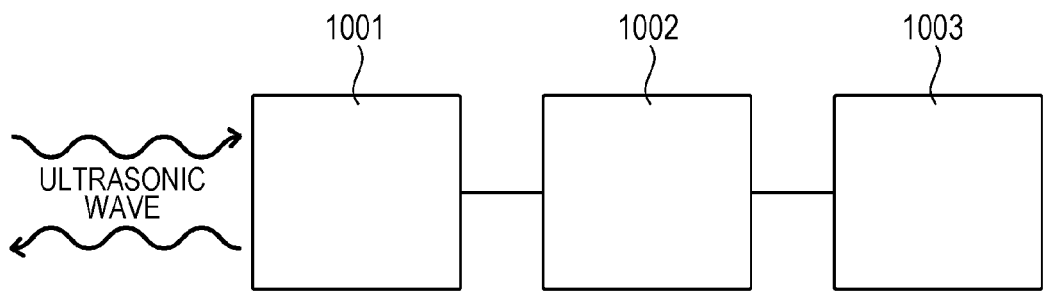

An ultrasonic inspection device according to the present invention comprises an ultrasonic probe as defined above, a signal processing unit and an image generation unit. FIG. 11B is a schematic view of an ultrasonic inspection device according to the present invention, showing an exemplary configuration thereof. Note, however, that the connection sequence of the component members of an ultrasonic inspection device according to the present invention is by no means limited to the illustrated one. In the ultrasonic inspection device illustrated in FIG. 11B, the signal processing unit 1002 operates for data conversion and data storage for the electric signal originating from reflected waves that is received by the ultrasonic probe 1001 and the image generation unit 1003 converts the data into image information. The ultrasonic inspection device additionally has a function of transmitting the image information to an external image display unit (display).

(Acoustic Component)

Now, an acoustic component according to the present invention will be described below.

Figure 12:
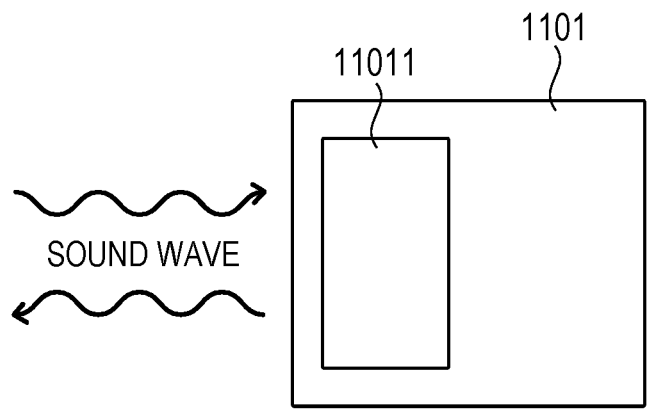
FIG. 12 is a schematic view of an acoustic component according to the present invention, showing an exemplary configuration thereof.

An acoustic component according to the present invention comprises a piezoelectric actuator as defined above and transmits or receives sounds by driving the piezoelectric actuator. FIG. 12 is a schematic view of an acoustic component according to the present invention, showing an exemplary configuration thereof. Note, however, that the number, the shapes and the arrangement positions of the component members thereof are by no means limited to those illustrated in FIG. 12. The acoustic component 1101 illustrated in FIG. 12 contains a piezoelectric actuator 11011 and has a function of transmitting sound waves generated due to the inverse piezoelectric effect of the piezoelectric actuator 11011 and receiving sound waves coming from outside by means of the (positive or forward) piezoelectric effect thereof. An acoustic component according to the present invention may additionally comprise a vibration plate for amplifying sound waves. The undulating arrow marks in FIG. 12 schematically illustrate how sound waves propagate and do not indicate any component member of the acoustic component 1101. Examples of acoustic component include microphones, speakers and buzzers.

(Angular Velocity Sensor)

Now, an angular velocity sensor according to the present invention will be described below.

Figure 13:
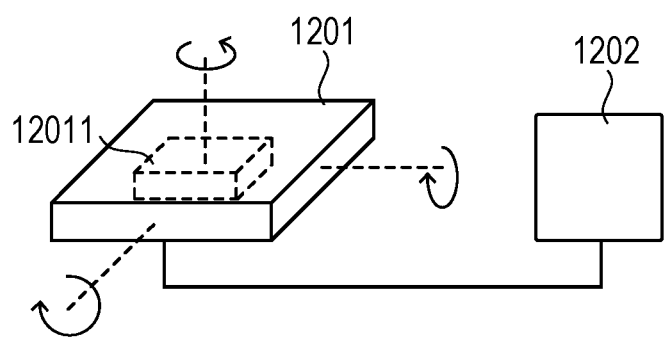
FIG. 13 is a schematic view of an angular velocity sensor according to the present invention, showing an exemplary configuration thereof.

An angular velocity sensor according to the present invention comprises a piezoelectric element as defined above and transforms any change in the shape of the piezoelectric element into angular velocity information. FIG. 13 is a schematic view of an angular velocity sensor according to the present invention, showing an exemplary configuration thereof. Note, however, that the number, the shapes and the arrangement positions of the component members thereof are by no means limited to those illustrated in FIG. 13. The angular velocity sensor 1201 illustrated in FIG. 13 contains a piezoelectric element 12011 and the shape of this piezoelectric element 12011 is caused to vary by the Coriolis force generated in response to the rotational motion of the main body of the angular velocity sensor 1201 around the three axes thereof. The variance in the shape of the piezoelectric element 12011 is turned into an electric signal by the (forward) piezoelectric effect of the piezoelectric element and then transformed into information on the angular velocity by a signal processing unit 1202 arranged in the inside or at the outside of the angular velocity sensor. The angular velocity sensor 1201 may comprise one or more than one component members other than the piezoelectric element 12011 and the configuration of any known vibration type angular velocity sensor (gyro sensor) can be applied to that of the angular velocity sensor 1201. The arrow marks and the accompanying dotted lines in FIG. 13 are signs that schematically show the directions of the rotational motion around the three axes and they do not indicate any component member of the angular velocity sensor 1201.

(Vibration Power Generation Device)

Now, a vibration power generation device according to the present invention will be described below.

Figure 14:
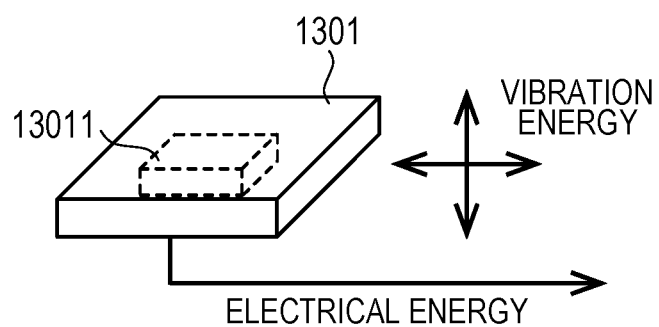
FIG. 14 is a schematic view of a vibration power generation device according to the present invention, showing an exemplary configuration thereof.

A vibration power generation device according to the present invention comprises a piezoelectric element as defined above and transforms vibration energy into electric energy. FIG. 14 is a schematic view of a vibration power generation device according to the present invention, showing an exemplary configuration thereof. Note, however, that the number, the shapes and the arrangement positions of the component members thereof are by no means limited to those illustrated in FIG. 14. The vibration power generation device 1301 of the present invention as illustrated in FIG. 14 contains a piezoelectric element 13011 and has a function of power generation of transforming external vibration energy into electric energy by utilizing the positive piezoelectric effect of the piezoelectric element 13011. The vibration power generation device 1301 may additionally comprise a vibration reception section for adjusting the direction and the frequency of external vibrations.

(Surface Acoustic Wave Generating Device)

Now, a surface acoustic wave generating device according to the present invention will be described below.

As shown in FIG. 15A, a surface acoustic wave generating device according to the present invention comprises a substrate 101, a piezoelectric film 103 and a piezoelectric elements of the second embodiment having a pair of comb-shaped electrodes 105.

Figure 15B:
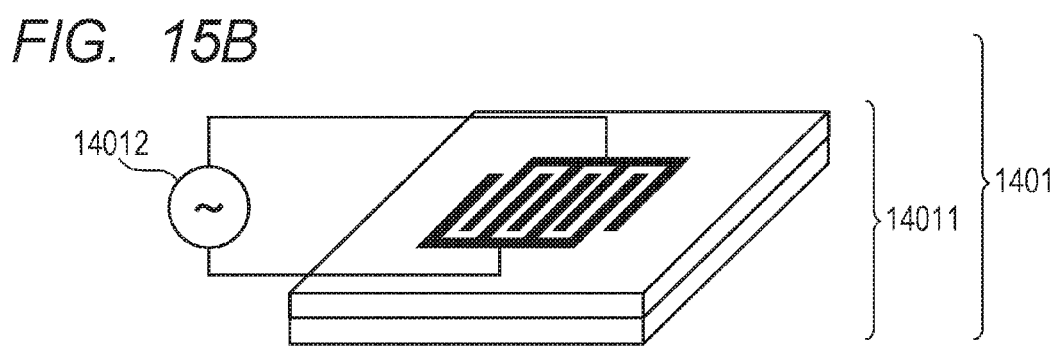

FIG. 15B is a schematic view of a surface acoustic wave generating device according to the present invention, showing an exemplary configuration thereof. Note, however, that the number, the shapes and the arrangement positions of the component members thereof are by no means limited to those illustrated in FIG. 15B. The surface acoustic wave generating device 1401 of the present invention as shown in FIG. 15B contains a piezoelectric element 14011 as defined above and generates (is excited to oscillate) surface acoustic waves between the input side comb-shaped interdigital electrode (IDT: interdigital transducer) and the output side comb-shaped interdigital electrode as an alternating voltage is applied between them from a power source 14012. At this time, when the wavelength of the surface acoustic wave is a multiple of the width of a unit pair of IDTs, which IDTs are cyclically arranged, the surface acoustic waves generated at the respective electrodes are in phase and the waves propagate in an excellent manner.

(Piezoelectric Shutter)

Now, a piezoelectric shutter according to the present invention will be described below.

A piezoelectric shutter according to the present invention comprises a surface acoustic wave generating device as defined above and a light shielding member and has a function of moving the light shielding member by driving the surface acoustic wave generating device.

Figure 15C:
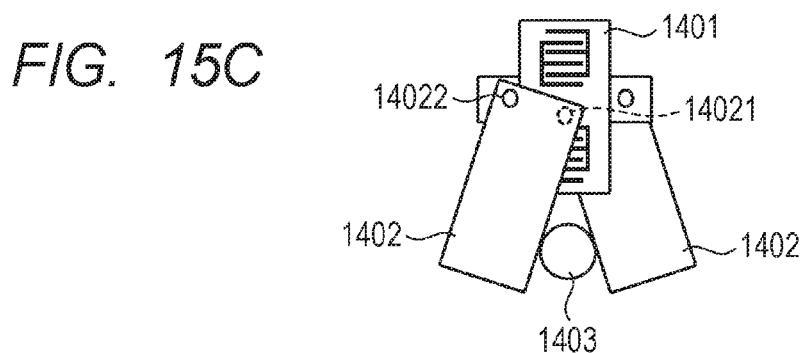
Figure 15D:
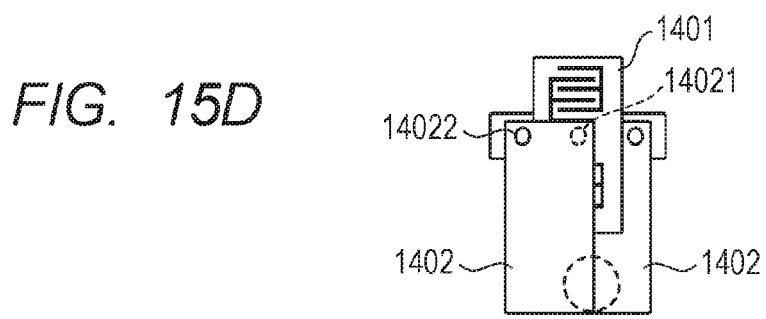

FIGS. 15C and 15D are schematic views of a piezoelectric shutter according to the present invention, showing an exemplary configuration thereof. Note, however, that the number, the shapes and the arrangement positions of the component members thereof are by no means limited to those illustrated in FIGS. 15C and 15D. The piezoelectric shutter of the present invention illustrated in FIG. 15C comprises a surface acoustic wave generating device 1401 having piezoelectric films and IDTs on the opposite surfaces thereof and an opaque light shielding member 1402 having movable projecting portions 14021, which are portions that frictionally contact the opposite surfaces of the surface acoustic wave generating device 1401, and a rotating shaft portion 14022 that is fitted to a cabinet (not indicated by a numeral) and hence cannot move but can rotate. Light receiving portion 1403 is an external member arranged at the backside of the FIG. 15C in order to detect light passing through the piezoelectric shutter and hence it is not included in the piezoelectric shutter. As an alternating voltage is applied to the surface acoustic wave generating device 1401 to generate surface acoustic waves that move the movable projecting portion 14021 upward in FIG. 15C in a state where the light receiving portion 1403 is not covered by the light shielding member 1402 (at an open position) as shown in FIG. 15C, the light shielding member 1402 starts rotating around the rotational shaft 14022 and eventually gets into a state as shown in FIG. 15D (at a closed position). The light shielding member 1402 can also be shifted from the closed position to the open position by moving the movable projection portion 14021 downwardly.

(Other Applications)

Besides the above described applications, a piezoelectric element and a piezoelectric actuator according to the present invention can find applications over the entire field of piezoelectric elements that involve the use of piezoelectric functions. Examples of applications of a piezoelectric element and/or a piezoelectric actuator according to the present invention include piezoelectric sensors, ferroelectric memories, frequency filters and piezoelectric oscillators. The piezoelectric element according to the present invention can be mounted on any of various electronic instruments other than the above described instances. An excellent electronic instrument can be formed by making it comprise a component member and a piezoelectric element arranged on the member.

EXAMPLES

Now, the present invention will be described in greater detail by way of examples. Note, however, that the present invention is by no means limited to the examples that are described below.

Piezoelectric elements according to the present invention as described below were prepared in the examples that are described below.

(Piezoelectric Element)

Example 1

A 400 nm-thick platinum electrode was formed as the first electrode on a commercially available silicon substrate by means of DC sputtering. A titanium oxide film was formed to a thickness of 30 nm as an adhesion layer between the first electrode and the silicon substrate.

Then, a piezoelectric film containing Ba, Bi, Ti, Zr, Fe and Mn was formed on the first electrode by means of CSD.

More specifically, a piezoelectric film containing a metal oxide expressed by $(Ba_{1-y}Bi_y)(Ti_{1-x-z}Zr_xFe_z)O_3$ of the general formula (1), where x=0.020, y=0.005 and z=0.005, or $(Ba_{0.995}Bi_{0.005})(Ti_{0.975}Zr_{0.020}Fe_{0.005})O_3$, and Mn by 0.005 mols relative to 1 mol of the metal oxide of the general formula (1) was prepared.

As the precursor liquid material to be applied by means of CSD, a liquid prepared by mixing alkoxides of the metals and dispersing them in an organic solvent was used. $Ba(OC_2H_5)_2$ was used as Ba source material. $Ti(OC_2H_5)_4$ was used as Ti source material. $Zr(O-n-C_4H_9)_4$ was used as Zr source material. $Bi(O-n-C_3H_7)_3$ was used as Bi source material. $Mn(O-i-C_3H_7)_2$ was used as Mn source material. 1-methoxy-2-propanol was used as organic solvent. However, similar results were obtained when popular organic solvents including diethylene glycol monoethyl ether, acetyl acetone, ethanol, isopropyl alcohol, n-butanol, ethylene glycol, propylene glycol, n-Butyl acetate, xylene, toluene and octane were used for the purpose of enhancing the stability and adjusting the viscosity of the material liquids. As stabilizer, 1,8-diazabicyclo [5.4.0]-7-undecene was used. The concentration of the metal ingredients in the precursor liquid material was made to be between 20 and 25 mass % in terms of metal oxides.

The precursor liquid material was applied onto the first electrode by spin coating at room temperature (2,000 rpm) and the film coat formed by the application was dried by means of a hot plate (at temperatures between 250° C. and 400° C. Thereafter, the film coat formed by the application was calcined by putting the substrate in an electric furnace at 700° C. and leaving it there for 15 minutes. The application, the drying and the calcination steps were repeated eight times and then the substrate was put in an electric furnace at 730° C. and left there for 60 minutes to obtain a crystallized piezoelectric film.

Subsequently, a 400 nm-thick platinum electrode was formed as the second electrode on the piezoelectric film by DC sputtering. A 30 nm-thick titanium oxide film was formed between the second electrode and the piezoelectric film as an adhesion layer.

A piezoelectric element according to the present invention was obtained in the above described manner.

The piezoelectric element was cut apart and the cross section was observed through a microscope. As a result, it was confirmed that the silicon substrate, the first electrode, the piezoelectric film and the second electrode had been sequentially laid in the above-described order. The piezoelectric film was substantially flat at the portion thereof that was sandwiched between the first electrode and the second electrode and, as a result of measuring the film thickness at a plurality of spots, the maximum film thickness $T_P$ was found to be equal to 2,100 nm. The average value $(T_{E1}+T_{E2})/2$ of the maximum film thickness $T_{E1}$ and the minimum film thickness $T_{E2}$ of the first electrode and the second electrode was 400 nm. The composition analysis of the interface portion of the first electrode and the substrate was executed by means of a combination of an observation through a transmission-type electron microscope and electron energy loss spectroscopy to find that an adhesion component comprising a metal Ti ingredient existed. A cross section of the piezoelectric film portion was observed through a transmission-type electron microscope to find that a texture of columnar crystal grains had been formed substantially over the entire region of the cross section on the basis of light areas and shaded areas that were produced as a result of electron beam diffractions. The crystal grain diameter at the film surface was 1,500 nm in terms of average circle equivalent diameter.

An X-ray diffraction measurement was conducted on the piezoelectric film portion of the piezoelectric element and only a peak that corresponds to an unoriented perovskite structure of tetragonal crystal was observed over the entire temperature range between −30° C. and 50° C. The lattice constant of the tetragonal crystal structure as reduced from the peak was compared with the known lattice constant of a bulk ceramic product having the same composition to find that the piezoelectric film of the piezoelectric element of the example had internal residual stress in the tensile direction that was attributable to substrate confinement.

The second electrode of the piezoelectric element was removed by a polishing treatment and the composition of the piezoelectric film portion was analyzed by an XRF measurement to find that the principal ingredient of the piezoelectric film was a metal oxide that can be expressed by a chemical formula of $(Ba_{0.995}Bi_{0.005})(Ti_{0.975}Zr_{0.020}Fe_{0.005})O_3$. Additionally it was found that the piezoelectric film contained element Mn by 0.005 mols (m=0.005) relative to 1 mol of the metal oxide.

The piezoelectric element was placed in the inside of an environmental test box whose temperature was controlled to −30° C. and 50° C. and the first electrode and the second electrode were connected to an impedance analyzer (4194A, available from Agilent Technologies) that was arranged outside the text box in order to measure the electrostatic capacity and the dielectric loss at each temperature. The applied voltage and the frequency used for the measurement were respectively 0.05 V and 1 kHz. As a result, the dielectric loss of the piezoelectric element of Example 1 was 0.60% (0.0060) at maximum within the range between −30° C. and 50° C. The Curie temperature of the piezoelectric film contained in the piezoelectric element of Example 1 was 155° C.

Then, the piezoelectric element of this example was cut to a strip-shaped piece having a length of 15 mm and a width of 2.5 mm and a cantilever was prepared by using the piece for the purpose of measuring the piezoelectric constant $d_{31}$ of the element. As the cantilever was firmly secured at one of the longitudinal opposite ends thereof and an alternating voltage was applied to the piezoelectric element, the end of the piezoelectric element located opposite to the firmly secured end thereof vertically reciprocates. The piezoelectric constant $d_{31}$ of the piezoelectric element can be determined by way of reduction by measuring the amount of displacement of the end by means of a Doppler displacement meter and using information on the shape and the Young's modulus of the cantilever.

The cantilever was placed in the inside of an environmental test box whose temperature was controlled to between −30° C. and 50° C. and a laser beam was irradiated onto it through a translucent window of the test box to measure the constant $d_{31}$ at each temperature. The maximum piezoelectric constant $d_{31}$ was observed at −30° C. The absolute value $|d_{31}|$ of the maximum value was 120 pm/V. The minimum constant $d_{31}$ was observed at 50° C. and $|d_{31}|$ was 70 pm/V. The value of $|d_{31}|$ at 25° C. was 100 pm/V.

Example 2

The piezoelectric element of this example was prepared as in Example 1 except that RF sputtering was used instead of CSD to prepare the piezoelectric film of the piezoelectric element.

A sintered compact having a composition that corresponded to the target composition of the piezoelectric film of the piezoelectric element of this example was prepared for the purpose of using it as target of the sputtering operation. Note, however, that A-site elements such as Ba and Bi were excessively used so as to make them to be excessively found in the target of sintered compact by taking differences of evaporation speed during the film forming process using sputtering into consideration.

More specifically, the material to be used for the target that corresponds to $(Ba_{0.995}Bi_{0.005})_{1.05}(Ti_{0.975}Zr_{0.020}Fe_{0.005})O_3$ was prepared by weighing the ingredients in a manner as described below.

Powdery reagents of barium carbonate, bismuth oxide, titanium oxide, zirconium oxide, iron oxide and manganese dioxide all of whose purities were not less than 99.5% and that were commercially available were mixed. At this time, the reagents were weighed so as to make Ba, Bi, Ti, Zr, Fe and Mn show a ratio equal to the ratio of the ingredients in the composition of $(Ba_{0.995}Bi_{0.005})_{1.05}(Ti_{0.975}Zr_{0.020}Fe_{0.005})O_3+0.005MnO_2$. The mixture powder was produced by 24 hours dry mixing, using a bowl mill. The total weight of the mixture powder was defined as 100 weight portions and 3 weight portions of a PVA binder relative to the mixture powder was forced to adhere to the surface of the mixture powder by means of a spray dryer so as to cause them to granulate. The obtained granulated powder was filled in a metal mold and molding pressure of 200 MPa was applied to the granulated powder by means of a press molding machine to produce a disc-shaped molded object. The obtained molded object was put into an electric furnace and held at high temperatures with a maximum temperature of 1,350° C. for 4 hours so as to be sintered in the atmosphere for a total of 24 sintering hours to obtain a target sintered body.

This target sintered body was used to produce a piezoelectric film by RF sputtering on the first electrode formed on a substrate same as that of Example 1. The maximum film thickness of the piezoelectric film of this embodiment was made equal to that of Example 1 by adjusting the film forming time. For the atmosphere in the inside of the sputtering apparatus, argon and oxygen were mixed at a ratio in the range between 10:1 and 20:1 and a degree of vacuum of about 0.5 Pa was maintained in the inside of the sputtering apparatus. The film forming process was executed in a state where the back surface of the substrate (the surface opposite to the surface where the first electrode was arranged) was continuously heated to 650° C.

The obtained piezoelectric element showed a structure where the silicon substrate, the first electrode, the piezoelectric film and the second electrode were sequentially laid in the above described order. The maximum film thickness $T_P$ was 2,100 nm. The average value $(T_{E1}+T_{E2})/2$ of the maximum film thickness $T_{E1}$ and the minimum film thickness $T_{E2}$ of the first electrode and the second electrode was 400 nm. An adhesion component made of a Ti metal ingredient existed at the interface portion between the first electrode and the substrate. A texture of columnar crystal grains was formed substantially over the entire region of the cross section of the piezoelectric film. The crystal grain diameter at the film surface was 1,400 nm in terms of average circle equivalent diameter. The piezoelectric film had tensile stress in the inside thereof. An X-ray diffraction measurement was conducted on the piezoelectric film portion of the piezoelectric element and only a peak that corresponds to an unoriented perovskite structure of tetragonal crystal was observed over the entire temperature range between −30° C. and 50° C. The composition of the piezoelectric film portion of this example was substantially the same as that of the piezoelectric film portion of Example 1.

The dielectric loss and the piezoelectric constant $d_{31}$ of the piezoelectric element of this example at each temperature were substantially the same as those of the piezoelectric element of Example 1. The Curie temperature of the piezoelectric film contained in the piezoelectric element was 165° C. Table 4 shows the detailed results of the measurements.

Examples 3 Through 25

Figure 16A:
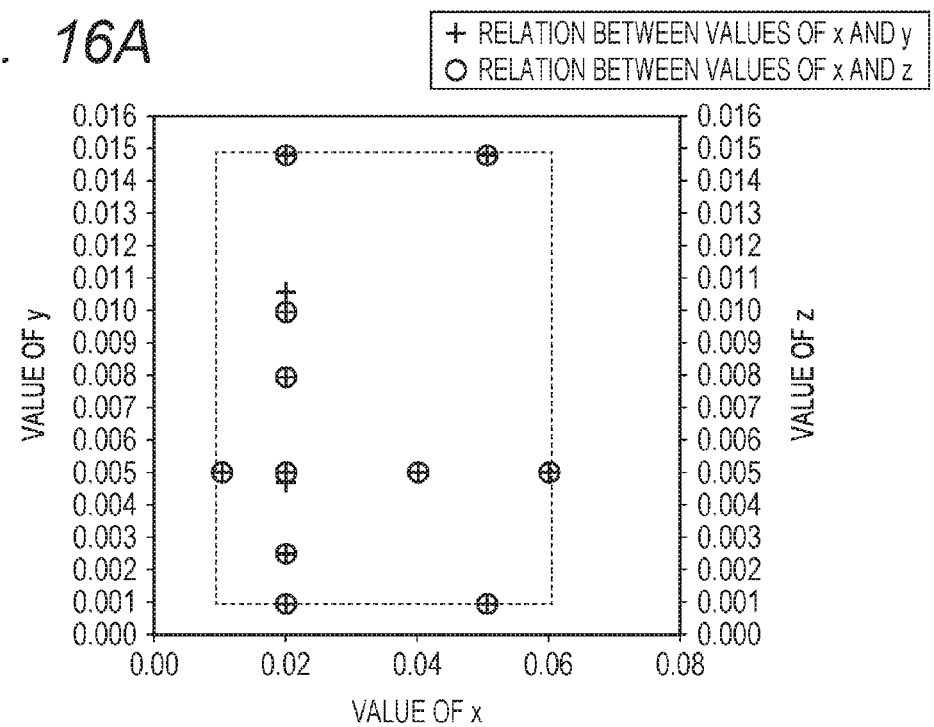
FIGS. 16A and 16B are schematic illustrations of the content ratios of the ingredients of the piezoelectric film portions of the embodiments of piezoelectric element according to the present invention.
Figure 16B:
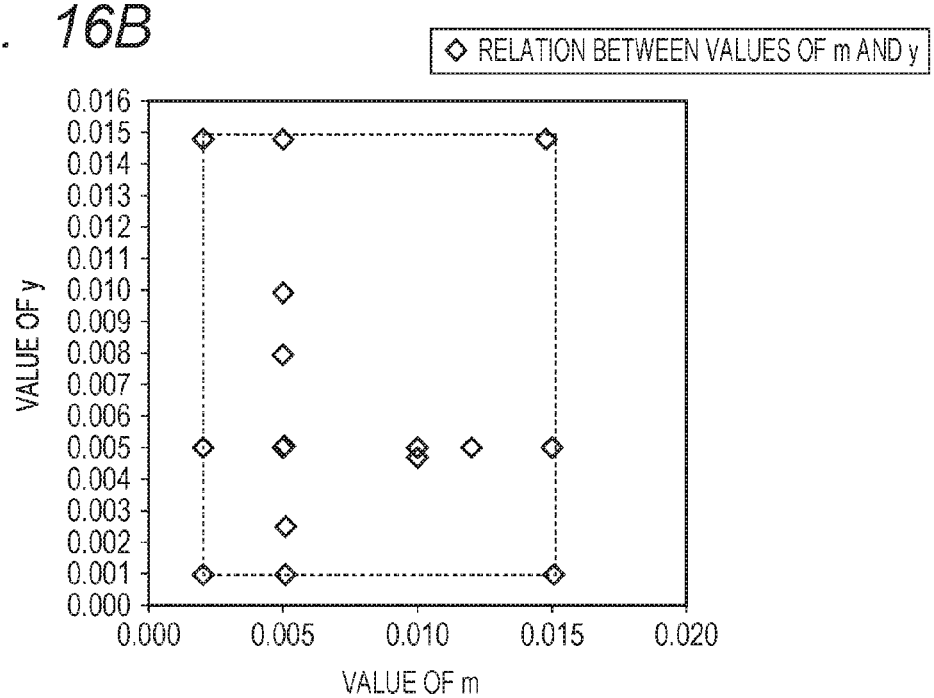

A piezoelectric element according to the present invention was prepared in each of these examples by a method similar to those used for preparing the piezoelectric elements of Examples 1 and 2. Table 1 shows the values of x, y, z, y/z and m that evidence the compositions of the piezoelectric films of these examples. FIGS. 16A and 16B shows the relationship between the x value and the y value, the relationship between the x value and the z value and the relationship between the x value and the m value of each of the examples. The marks in FIGS. 16A and 16B indicate the composition parameter values of the examples and the dotted lines in FIGS. 16A and 16B indicate the permissible ranges of values for the purpose of the present invention.

The values on the dotted lines are within the permissible ranges for the purpose of the present invention.

Table 2 shows the material of the substrate, that of the adhesion layer, the type, or the material, of the first electrode, the technique used for forming the piezoelectric film, the maximum temperature in the film forming process and the type, or the material, of the second electrode of each of the examples.

The expression of "100 oriented single crystal" of Example 23 in Table 2 refers to the MgO single crystal substrate cut out so as to make the film forming surface to be (100) plane. Similarly, an MgO single crystal substrate whose film forming surface was made to be (110) plane was employed in Example 24 and an MgO single crystal substrate whose film forming surface was made to be (111) plane was employed in Example 25.

The film forming method of "CSD" for the piezoelectric film in Table 2 means that the piezoelectric film was formed by the CSD method in each of the applicable examples as in the case of the film forming method of Example 1. On the other hand, the film forming method of "sputtering" in Table 2 means that the piezoelectric film was formed by the RF sputtering method in each of the applicable examples as in the case of the film forming method of Example 2.

Table 3 shows the maximum film thickness $T_P$ of the piezoelectric film and the average value of the maximum film thickness $T_{E1}$ and the minimum film thickness $T_{E2}$ of the first electrode and the second electrode, or $(T_{E1}+T_{E2})/2$, of each of the piezoelectric elements of the examples, that were measured as in Example 1.

In each of the piezoelectric elements of the examples, an adhesion component comprising a metal Ti ingredient existed at the interface portion between the first electrode and the substrate. A texture of columnar crystal grains was formed substantially over the entire region of the cross section of the piezoelectric film. As a result of an X-ray diffraction measurement, only a peak that corresponds to an unoriented perovskite structure of tetragonal crystal was observed over the entire temperature range between −30° C. and 50° C. The piezoelectric film portion had tensile stress in the inside thereof. Table 1 shows the composition of the piezoelectric film portion.

As shown in Table 3, the crystal grain diameter of each of the piezoelectric elements at the film surface was minimally 700 nm and maximally 3,500 nm.

Table 4 shows the Curie temperature and the dielectric loss and the piezoelectric constant $d_{31}$ at each temperature that were determined by measurement in each of the examples. The Curie temperature was minimally 130° C. and maximally 195° C. The maximum value of dielectric loss within the temperature range between −30° C. and 50° C. was found within the range between 0.0035 and 0.120.

Comparative Example 1

A piezoelectric element was prepared in Comparative Example 1 as in Example 1 except that the composition of the piezoelectric film was such that the film contained a metal oxide that can be expressed by chemical formula $Ba(Ti_{0.9}Zr_{0.1})O_3$ and an Mn oxide added at a ratio of 0.020 mols relative to 1 mol of the metal oxide by referring to Paragraph 0087 of Japanese Patent Application Laid-Open No. 2011-243722.

That a texture of columnar crystal grains had been formed was found at the cross section of the piezoelectric film. An X-ray diffraction measurement was conducted at 25° C. on the piezoelectric film portion of the piezoelectric element prepared for the purpose of comparison and only a peak that corresponds to an unoriented perovskite structure of orthorhombic crystal was observed.

Tables 3 and 4 show other physical properties of the piezoelectric element of the comparative example. The dielectric loss of the piezoelectric element prepared for the purpose of comparison was maximally 0.021 (50° C.) and minimally 0.011 (−30° C.) within the temperature range between −30° C. and 50° C. and exceeded the corresponding values of the piezoelectric elements of the above described examples over the entire temperature range selected for the measurements.

In the piezoelectric element prepared for the purpose of comparison, the maximum constant $d_{31}$ was observed at 25° C. The absolute value $|d_{31}|$ of the maximum value was 95 pm/V. The minimum constant $d_{31}$ was observed at −30° C. and $|d_{31}|$ was 40 pm/V. The absolute value $|d_{31}|$ at 50° C. was 60 pm/V. At any temperature within the above described temperature range, the value of $|d_{31}|$ of the piezoelectric element of Comparative Examples fell below $|d_{31}|$ of the piezoelectric element of Example 1.

TABLE 1

| | Principal ingredient | | | | | |
|---|---|---|---|---|---|---|
| | Ba | Bi | Ti | Zr | Fe | Mn | |
| | 1 − y | y | 1 − x − z | x | z | m | y/z |
| Ex. 1 | 0.995 | 0.005 | 0.975 | 0.020 | 0.005 | 0.005 | 1.000 |
| Ex. 2 | 0.995 | 0.005 | 0.975 | 0.020 | 0.005 | 0.005 | 1.000 |
| Ex. 3 | 0.995 | 0.005 | 0.985 | 0.010 | 0.005 | 0.005 | 1.000 |
| Ex. 4 | 0.995 | 0.005 | 0.955 | 0.040 | 0.005 | 0.005 | 1.000 |
| Ex. 5 | 0.995 | 0.005 | 0.935 | 0.060 | 0.005 | 0.005 | 1.000 |
| Ex. 6 | 0.995 | 0.005 | 0.985 | 0.010 | 0.005 | 0.012 | 1.000 |
| Ex. 7 | 0.995 | 0.005 | 0.955 | 0.040 | 0.005 | 0.012 | 1.000 |
| Ex. 8 | 0.995 | 0.005 | 0.935 | 0.060 | 0.005 | 0.012 | 1.000 |
| Ex. 9 | 0.995 | 0.005 | 0.975 | 0.020 | 0.005 | 0.002 | 1.000 |
| Ex. 10 | 0.995 | 0.005 | 0.975 | 0.020 | 0.005 | 0.010 | 1.000 |
| Ex. 11 | 0.995 | 0.005 | 0.975 | 0.020 | 0.005 | 0.015 | 1.000 |
| Ex. 12 | 0.999 | 0.001 | 0.979 | 0.020 | 0.001 | 0.005 | 1.000 |
| Ex. 13 | 0.998 | 0.002 | 0.978 | 0.020 | 0.002 | 0.005 | 1.000 |
| Ex. 14 | 0.992 | 0.008 | 0.972 | 0.020 | 0.008 | 0.005 | 1.000 |
| Ex. 15 | 0.990 | 0.010 | 0.970 | 0.020 | 0.010 | 0.005 | 1.000 |
| Ex. 16 | 0.985 | 0.015 | 0.966 | 0.020 | 0.015 | 0.005 | 1.000 |
| Ex. 17 | 0.999 | 0.001 | 0.949 | 0.050 | 0.001 | 0.002 | 1.000 |
| Ex. 18 | 0.999 | 0.001 | 0.949 | 0.050 | 0.001 | 0.015 | 1.000 |
| Ex. 19 | 0.985 | 0.015 | 0.935 | 0.050 | 0.015 | 0.002 | 1.000 |
| Ex. 20 | 0.985 | 0.015 | 0.935 | 0.050 | 0.015 | 0.015 | 1.000 |
| Ex. 21 | 0.995 | 0.0047 | 0.975 | 0.020 | 0.0050 | 0.010 | 0.940 |
| Ex. 22 | 0.989 | 0.0106 | 0.970 | 0.020 | 0.0100 | 0.010 | 1.060 |
| Ex. 23 | 0.995 | 0.005 | 0.975 | 0.020 | 0.005 | 0.005 | 1.000 |
| Ex. 24 | 0.995 | 0.005 | 0.975 | 0.020 | 0.005 | 0.005 | 1.000 |
| Ex. 25 | 0.995 | 0.005 | 0.975 | 0.020 | 0.005 | 0.005 | 1.000 |
| Comp. Ex. 1 | 1.000 | 0.000 | 0.900 | 0.100 | 0.000 | 0.020 | — |

TABLE 2

|  | Substrate | Adhesion layer | 1st electrode | Piezo-electric film forming method | Film forming maximum temp. [° C.] | 2nd electrode |
|---|---|---|---|---|---|---|
| Ex. 1 | Silicon | Ti | Pt | CSD | 730 | Pt |
| Ex. 2 | Silicon | Ti | Pt | Sputtering | 650 | Pt |
| Ex. 3 | Silicon | Ti | Pt | CSD | 730 | Pt |
| Ex. 4 | Silicon | Ti | Pt | CSD | 730 | Pt |
| Ex. 5 | Silicon | Ti | Pt | CSD | 750 | Pt |
| Ex. 6 | Silicon | Ti | Pt | CSD | 730 | Au |
| Ex. 7 | Silicon | Ti | Pt | Sputtering | 650 | Au |
| Ex. 8 | Silicon | Ti | Pt | CSD | 750 | Au |
| Ex. 9 | Silicon | Ti | Pt | CSD | 730 | Pt |
| Ex. 10 | Silicon | Ti | Pt | CSD | 730 | Pt |
| Ex. 11 | Silicon | Ti | Pt | CSD | 780 | Pt |
| Ex. 12 | Silicon | Ti | Pt | CSD | 750 | Pt |
| Ex. 13 | Silicon | Ti | Pt | CSD | 730 | Pt |
| Ex. 14 | Silicon | Ti | Pt | Sputtering | 650 | Pt |
| Ex. 15 | Silicon | Ti | Pt | CSD | 730 | Pt |
| Ex. 16 | Silicon | Ti | Pt | CSD | 700 | Pt |
| Ex. 17 | Silicon | Ti | Pt | CSD | 730 | Pt |
| Ex. 18 | Silicon | Ti | Pt | CSD | 780 | Pt |
| Ex. 19 | Silicon | Ti | Pt | CSD | 700 | Pt |
| Ex. 20 | Silicon | Ti | Pt | CSD | 700 | Pt |
| Ex. 21 | Silicon | Ti | Pt | CSD | 730 | Pt |
| Ex. 22 | Silicon | Ti | Pt | CSD | 730 | Pt |
| Ex. 23 | 100 oriented single crystal | Ti | Pt | Sputtering | 650 | Pt |
| Ex. 24 | 110 oriented single crystal | Ti | Pt | Sputtering | 650 | Pt |
| Ex. 25 | 111 oriented single crystal | Ti | Pt | Sputtering | 650 | Pt |
| Comp. Ex. 1 | Silicon | Ti | Pt | CSD | 730 | Pt |

TABLE 3

|  | $T_P$ [nm] | $(T_{E1} + T_{E2})/2$ [nm] | crystal structure | crystal grain cross section | film surface crystal grain diameter [nm] | residual stress | State of orientation |
|---|---|---|---|---|---|---|---|
| Ex. 1 | 2100 | 400 | tetragonal crystal | columnar | 1500 | tensile | random |
| Ex. 2 | 1900 | 400 | tetragonal crystal | columnar | 1400 | tensile | random |
| Ex. 3 | 2100 | 400 | tetragonal crystal | columnar | 1200 | tensile | random |
| Ex. 4 | 2100 | 400 | tetragonal crystal | columnar | 1700 | tensile | random |
| Ex. 5 | 2100 | 400 | tetragonal crystal | columnar | 2000 | tensile | random |
| Ex. 6 | 3500 | 500 | tetragonal crystal | columnar | 1100 | tensile | random |
| Ex. 7 | 3500 | 200 | tetragonal crystal | columnar | 900 | tensile | random |
| Ex. 8 | 3500 | 500 | tetragonal crystal | columnar | 1200 | tensile | random |
| Ex. 9 | 1500 | 250 | tetragonal crystal | columnar | 2300 | tensile | random |
| Ex. 10 | 1500 | 250 | tetragonal crystal | columnar | 2100 | tensile | random |
| Ex. 11 | 1500 | 250 | tetragonal crystal | columnar | 2000 | tensile | random |
| Ex. 12 | 2100 | 400 | tetragonal crystal | columnar | 1200 | tensile | random |
| Ex. 13 | 2100 | 400 | tetragonal crystal | columnar | 1500 | tensile | random |

TABLE 3-continued

| | $T_P$ [nm] | $(T_{E1} + T_{E2})/2$ [nm] | crystal structure | crystal grain cross section | film surface crystal grain diameter [nm] | residual stress | State of orientation |
|---|---|---|---|---|---|---|---|
| Ex. 14 | 2100 | 200 | tetragonal crystal | columnar | 1600 | tensile | random |
| Ex. 15 | 2100 | 400 | tetragonal crystal | columnar | 1500 | tensile | random |
| Ex. 16 | 2100 | 400 | tetragonal crystal | columnar | 3500 | tensile | random |
| Ex. 17 | 2100 | 400 | tetragonal crystal | columnar | 1600 | tensile | random |
| Ex. 18 | 2100 | 400 | tetragonal crystal | columnar | 1400 | tensile | random |
| Ex. 19 | 2100 | 400 | tetragonal crystal | columnar | 4100 | tensile | random |
| Ex. 20 | 2100 | 400 | tetragonal crystal | columnar | 2600 | tensile | random |
| Ex. 21 | 2100 | 400 | tetragonal crystal | columnar | 1200 | tensile | random |
| Ex. 22 | 2100 | 400 | tetragonal crystal | columnar | 2600 | tensile | random |
| Ex. 23 | 1500 | 400 | tetragonal crystal | columnar | 800 | compressive | 100 oriented |
| Ex. 24 | 1500 | 400 | tetragonal crystal | columnar | 700 | compressive | 110 oriented |
| Ex. 25 | 1500 | 400 | tetragonal crystal | columnar | 1000 | compressive | 111 oriented |
| Comp. Ex. 1 | 2100 | 400 | orthorhombic crystal | not columnar | 2500 | tensile | random |

TABLE 4

| | Curie temp. [° C.] | $|d_{31}|$ [pm/V] −30° C. | $|d_{31}|$ [pm/V] 25° C. | $|d_{31}|$ [pm/V] 50° C. | dielectric loss maximum value (−30 to 50° C.) |
|---|---|---|---|---|---|
| Ex. 1 | 155 | 120 | 100 | 70 | 0.0060 |
| Ex. 2 | 165 | 120 | 100 | 70 | 0.0060 |
| Ex. 3 | 165 | 110 | 80 | 60 | 0.0055 |
| Ex. 4 | 150 | 145 | 110 | 80 | 0.0065 |
| Ex. 5 | 130 | 160 | 115 | 85 | 0.0075 |
| Ex. 6 | 160 | 105 | 75 | 55 | 0.0050 |
| Ex. 7 | 180 | 135 | 105 | 70 | 0.0060 |
| Ex. 8 | 155 | 150 | 110 | 75 | 0.0070 |
| Ex. 9 | 155 | 120 | 95 | 65 | 0.0075 |
| Ex. 10 | 160 | 120 | 100 | 75 | 0.0050 |
| Ex. 11 | 165 | 110 | 100 | 60 | 0.0080 |
| Ex. 12 | 155 | 115 | 95 | 70 | 0.0050 |
| Ex. 13 | 155 | 120 | 100 | 70 | 0.0040 |
| Ex. 14 | 155 | 125 | 105 | 75 | 0.0065 |
| Ex. 15 | 155 | 125 | 105 | 75 | 0.0065 |
| Ex. 16 | 145 | 125 | 105 | 75 | 0.0065 |
| Ex. 17 | 155 | 150 | 115 | 80 | 0.0060 |
| Ex. 18 | 160 | 135 | 105 | 70 | 0.0080 |
| Ex. 19 | 150 | 155 | 120 | 85 | 0.0065 |
| Ex. 20 | 155 | 150 | 125 | 70 | 0.0080 |
| Ex. 21 | 155 | 115 | 95 | 65 | 0.0060 |
| Ex. 22 | 155 | 120 | 100 | 70 | 0.0120 |
| Ex. 23 | 195 | 145 | 120 | 85 | 0.0040 |
| Ex. 24 | 195 | 135 | 110 | 75 | 0.0035 |
| Ex. 25 | 195 | 140 | 115 | 80 | 0.0040 |
| Comp. Ex. 1 | 115 | 40 | 95 | 60 | 0.0210 |

Example 26

A piezoelectric element of the second embodiment having a configuration as shown in FIG. 15A was prepared. More specifically, a piezoelectric element was prepared by a method same as the method used for Example 1 except that the first electrode was not arranged and the second electrode was formed as comb-shaped electrodes. A value of 25 μm was selected for the electrode pitch of the comb-shaped electrodes and a value of 10 μm was selected for the electrode width while a value of 15 μm was selected for the gap.

Additionally, an external power switch was connected to each of the oppositely disposed comb-shaped electrodes as shown in FIG. 15B to prepare a surface acoustic wave generating device according to the present invention. Excited oscillations of a surface acoustic wave that reflected the input alternating voltage was confirmed.

(Influence of Selected Manufacturing Method)

As seen from the figures relating to Example 1 and Example 2 shown in Table 2, the selected method of manufacturing a piezoelectric element according to the present invention did not influence the characteristics of the manufactured piezoelectric element and similar characteristics were obtained regardless if the selected manufacturing method was CSD or sputtering. The advantages of the present invention were confirmed regardless of the selected manufacturing method as seen from the figures relating to the remaining Examples, or Examples 3 through 25.

(Influence of Quantities of Bi and Fe)

As the values of y and z that show the Bi molar ratio were increased from 0.005, the piezoelectric constant at each temperature also increased. As seen from the results obtained from Example 16 where the quantity of Mn was similar to that of Example 1, Example 16 showed a piezoelectric constant that was greater than that of Example 1 by about 3% at y=z=0.015. However, the dielectric loss was minimally not less than 2% in the temperature range between −30° C. and 50° C. when y=z=0.02 was used.

When, on the other hand, the values of y and z that show the Bi molar ratio was decreased from the corresponding value of Example 1, which was 0.005, piezoelectric characteristics similar to those of Example 1 were obtained down to y=z=0.002. A piezoelectric constant that was substantially equal to about 95% of Example 1 was obtained at each temperature even at y=z=0.001. However, when y=z=0 was selected as in Example 1, the piezoelectric constant at −30° C. became less than 55% of that of Example 1.

When y/z, which was the molar ratio of Bi and Fe, was made to vary within the range between 0.90 and 1.10, both the piezoelectric constant and the dielectric loss did not show any change at all at each temperature of the piezoelectric element. However, when the value of y/z became less than 0.90, the piezoelectric constant dramatically fell (by more than 10%). On the other hand, when the value of y/z exceeded 1.10, the dielectric loss drastically raised (by more than 10%).

(Influence of Quantity of Mn)

When the content ratio of Mn was raised from 0.005 mols relative to 1 mol of the metal oxide, which was the principal ingredient, piezoelectric characteristics similar to those of Example 1 were obtained up to 0.015 mols. However, when the quantity of Mn was raised to 0.02 mols, the dielectric loss in the temperature range between −30° C. and 50° C. became minimally not less than 15%.

When, on the other hand, the Mn content was reduced from 0.005 mols, piezoelectric characteristics similar to those of Example 1 were obtained down to 0.002 mols. However, when the Mn addition was reduced to nil, the piezoelectric constant dramatically fell (by not less than 20%) and the dielectric loss increased also dramatically (by not less than 30%).

(Influence of Quantity of Zr)

When the value of x that shows the Zr molar ratio was raised from 0.020, the piezoelectric constant increased within the temperature range between −30° C. and 50° C. When x=0.060 was selected, the piezoelectric constant became greater than that of the piezoelectric element of Example 1 by 15 to 30% over the entire temperature range. When, however, x=0.070 was selected, the dielectric loss observed at 50° C. exceeded 1% due to the influence of the fall of the Curie temperature. When, on the other hand, the value of x that shows the Zr molar ratio was reduced from 0.020, the fall of the piezoelectric constant was less than 10% at each temperature but the piezoelectric constant fell by not less than 25% when x=0.008 was selected.

(Piezoelectric Actuator)

A piezoelectric actuator having a structure as shown in FIGS. 3A and 3B was prepared by using the piezoelectric element of this example to confirm that the thin piece portion of the piezoelectric actuator was displaced in response to the application of an alternating voltage. Note that a 5 μm-thick $SiO_2$ film was employed for the vibration plate of the piezoelectric actuator. The extent of displacement of the thin piece portion of the piezoelectric actuator realized by using the piezoelectric element of this example was not less than twice of the comparable extent of the piezoelectric actuator realized by using the piezoelectric element of Comparative Example.

(Liquid Ejection Head)

A liquid ejection head having a structure as shown in FIG. 4A was prepared by using the piezoelectric element of selected one of the above described examples. The liquid droplet ejection performance of the obtained liquid ejection head was evaluated by applying an alternating voltage of 20 V and 10 kHz to find that the liquid ejection head using the piezoelectric element of this example performed excellently.

(Liquid Ejection Device)

A liquid ejection device as shown in FIG. 4B was prepared by using the liquid ejection head of the above described example. That the prepared liquid ejection device ejected ink according to the input electric signal was confirmed.

(Vibration Correction Mechanism)

A vibration correction mechanism as shown in FIG. 5 was prepared by using the piezoelectric actuator of the above described example. A glass-made lens and a CMOS element were used as objects of conveyance. That the objects of conveyance produced a rotational motion according to the input electric signal was confirmed.

(Variable Optical Component)

A variable optical component as shown in FIG. 6A was prepared by using the piezoelectric actuator of the above described example. A polyacrylic acid-based plastic lens was used as the optical component. That the optical component was deformed according to the input electric signal was confirmed.

(Movable Optical Component)

A movable optical component as shown in FIG. 6B was prepared by using the piezoelectric actuator of the above described example. An aluminum-made metal rod was used for the piezoelectric strain transmitting section and a mirror formed by vapor-depositing aluminum on a glass plate was used as the optical component. That the optical component was moved according to the input electric signal was confirmed.

(Optical Instrument)

An optical instrument as shown in FIG. 7A was prepared by using the vibration correction mechanism of the above described example. That shifts of the light path of outgoing light due to external vibrations could be suppressed by the function of the vibration correction mechanism was confirmed.

Optical instruments as shown in FIGS. 7B and 7C were prepared respectively by using the variable optical component and the movable optical component of the related one of the above described examples. That the light path was shifted according to the applied alternating voltage was confirmed for each of the optical instruments.

(Imaging Device)

An imaging device as shown in FIG. 8 was prepared by using the vibration correction mechanism of the above described example. That variances in the picked up image attributable to external vibrations could be suppressed by the function of the vibration correction mechanism was confirmed.

(Optical Switch)

An optical switch as shown in FIG. 9A was prepared by using the variable optical component of the above described example that was formed by mechanically connecting the piezoelectric actuator of the above described example and an optical fiber. Switching operations of the optical switch according to the input electric signal was confirmed.

An optical switch as shown in FIG. 9B was prepared by mechanically connecting the piezoelectric actuator of the above described example and the element also shown in FIG. 9B. Switching operations of the optical switch according to the input electric signal was confirmed.

(Micromirror Device)

A micromirror device as shown in FIG. 10 was prepared by using the piezoelectric actuator of the above described example. An aluminum-made metal rod was used for the piezoelectric strain transmitting section. That the micromirror device produced a move and a rotational motion according to the input electric signal was confirmed.

(Ultrasonic Probe)

An ultrasonic probe as shown in FIG. 11A was prepared by using the piezoelectric actuator of the above described example. That the ultrasonic probe operated for transmission of ultrasonic waves according to the input electric signal and also for reception of ultrasonic waves reflected from the subject was confirmed.

(Ultrasonic Inspection Device)

An ultrasonic inspection device as shown in FIG. 11B was prepared by using the ultrasonic probe of the above described example. That the ultrasonic inspection device generated an ultrasonic image according to the input ultrasonic oscillation data with reduced noises was confirmed.

(Acoustic Component)

An acoustic component as shown in FIG. 12 was prepared by using the piezoelectric actuator of the above described example. That the acoustic component operated for transmission of sound waves according to the input electric signal and also for reception of sound waves coming from outside was confirmed.

(Angular Velocity Sensor)

An angular velocity sensor having a signal processing unit as shown in FIG. 13 was prepared by using the piezoelectric element of the above-described example. That the signal processing unit transformed the changes in the shape of the sensor such as those due to moves and rotational motions into angular information was confirmed.

(Vibration Power Generation Device)

A vibration power generation device as shown in FIG. 14 was prepared by using the piezoelectric element of the above described example. The prepared vibration power generation device was arranged on a mechanical pump and the mechanical pump was driven to operate to confirm that the vibration power generation device operated for power generation by transforming vibration energy into electric energy.

(Piezoelectric Shutter)

A piezoelectric shutter as shown in FIG. 15C was prepared by using the surface acoustic wave generating device of Example 3. Note that a piezoelectric film and comb-shaped electrodes were arranged on both of the surfaces of the substrate. That the piezoelectric shutter operated to move between a closed position and an open position according to the input electric signal was confirmed.

A piezoelectric element according to the present invention stably shows a high piezoelectric constant and a small dielectric loss within the temperature range between −30° C. and 50° C. Additionally, since the piezoelectric element does not contain lead, it puts little load on the environment. Therefore, a piezoelectric element according to the present invention can find applications in the field of piezoelectric actuators, liquid ejection heads, liquid ejection devices, vibration correction mechanisms, variable optical components, movable optical components, optical instruments, imaging devices, optical switches, micromirror devices, ultrasonic probes, ultrasonic inspection devices, acoustic components, angular velocity sensors, vibration power generation devices, surface acoustic wave generating devices and piezoelectric shutters as well as in the field of any of various other electronic instruments equipped with piezoelectric functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-231426, filed Nov. 27, 2015, which is hereby incorporated by reference herein in its entirety.

What is claimed is:

1. A piezoelectric element comprising:
   a substrate;
   a first electrode;
   a piezoelectric film; and
   a second electrode,
   wherein the piezoelectric film contains oxides of Ba, Bi, Ti, Zr, Fe and Mn,
   wherein a molar ratio y of Bi relative to a sum of Ba and Bi is $0.001 \leq y \leq 0.015$;
   wherein a molar ratio x of Zr relative to a sum of Ti, Zr, Fe and Mn is $0.010 \leq x \leq 0.060$,
   wherein a molar ratio z of Fe relative to the sum of Ti, Zr, Fe and Mn is $0.001 \leq z \leq 0.015$,
   wherein a molar ratio m of Mn relative to the sum of Ti, Zr, Fe and Mn is $0.0020 \leq m \leq 0.0150$, and
   wherein a relationship between y and z is expressed by $0.90 \leq y/z \leq 1.10$.

2. The piezoelectric element according to claim 1, wherein a maximum thickness $T_P$ of the piezoelectric film is not more than 10 μm in a region thereof sandwiched between the first electrode and the second electrode.

3. The piezoelectric element according to claim 1, wherein each of the first electrode and the second electrode has a maximum film thickness $T_{E1}$ and a minimum film thickness $T_{E2}$, and
   wherein an average value of $T_{E1}$ and $T_{E2}$, or $(T_{E1}+T_{E2})/2$, is $0.002 \times T_P \leq (T_{E1}+T_{E2})/2 \leq 500$ nm relative to a maximum thickness $T_P$ of the piezoelectric film in a region thereof sandwiched between the first electrode and the second electrode.

4. The piezoelectric element according to claim 1, wherein an adhesion component containing a metal of Group IV elements and/or a metal of Group V elements is interposed between the first electrode and the substrate.

5. The piezoelectric element according to claim 1, wherein the piezoelectric film has a texture formed of crystal grains having a columnar structure.

6. The piezoelectric element according to claim 1, wherein the piezoelectric film has a residual stress in a direction parallel with a surface of the substrate.

7. The piezoelectric element according to claim 1, wherein the piezoelectric film has a Curie temperature which is not lower than 121° C.

8. The piezoelectric element according to claim 1, wherein the piezoelectric film is formed of crystals having a perovskite structure which are selectively oriented in a direction perpendicular to a surface of the substrate.

9. A piezoelectric actuator comprising:
   the piezoelectric element according to claim 1 and a vibration plate carrying the piezoelectric element arranged thereon.

10. A vibration correction mechanism comprising:
    two or more piezoelectric actuators according to claim 9 arranged so as to expand/contract in not less than two directions in response to an application of a voltage.

11. An optical instrument comprising:
    the vibration correction mechanism according to claim 10 and an optical component held to the vibration correction mechanism.

12. An imaging device comprising:
    the vibration correction mechanism according to claim 10 and an imaging element unit held to the vibration correction mechanism.

13. A variable optical component comprising:
the piezoelectric actuator according to claim 9 and an optical component mechanically connected to the piezoelectric actuator and having a mechanism for causing a shape of the optical component to vary by deformation of the piezoelectric actuator.

14. An optical instrument comprising:
the variable optical component according to claim 13.

15. An optical switch comprising:
the variable optical component according to claim 13.

16. A movable optical component comprising:
the piezoelectric actuator according to claim 9 and an optical component mechanically connected to the piezoelectric actuator and having a mechanism for causing the optical component to be moved and/or rotated by deformation of the piezoelectric actuator.

17. An optical instrument comprising:
the movable optical component according to claim 16.

18. An optical switch comprising:
the movable optical component according to claim 16.

19. A micromirror device comprising:
a plurality of micromirrors and a plurality of piezoelectric actuators mechanically connected to respective micromirrors,
wherein the plurality of piezoelectric actuators are piezoelectric actuators according to claim 9.

20. An ultrasonic probe comprising the piezoelectric actuator according to claim 9 and having a function of oscillating ultrasonic waves and that of receiving reflected waves.

21. An ultrasonic inspection device comprising:
the ultrasonic probe according to claim 20;
a signal processing unit; and
an image generation unit.

22. An acoustic component comprising:
the piezoelectric actuator according to claim 9 so as to transmit or receive sounds by driving the piezoelectric actuator.

23. A liquid ejection head comprising:
a liquid chamber provided with a vibrating portion having the piezoelectric element according to claim 1 and an ejection port communicating with the liquid chamber.

24. A liquid ejection device comprising:
a mounting portion for receiving a transfer medium and the liquid ejection head according to claim 23.

25. An angular velocity sensor comprising:
the piezoelectric element according to claim 1,
wherein the angular velocity sensor is configured to transform a change in a shape of the piezoelectric element into angular velocity information.

26. A vibration power generation device comprising:
the piezoelectric element according to claim 1,
wherein the vibration power generation device is configured to transform vibration energy into electric energy by means of the piezoelectric element.

27. A piezoelectric element comprising:
a substrate;
a piezoelectric film; and
a plurality of comb-shaped electrodes,
wherein the piezoelectric film contains oxides of Ba, Bi, Ti, Zr, Fe and Mn,
wherein a molar ratio y of Bi relative to a sum of Ba and Bi is $0.001 \leq y \leq 0.015$,
wherein a molar ratio x of Zr relative to a sum of Ti, Zr, Fe and Mn is $0.010 \leq x \leq 0.060$,
wherein a molar ratio z of Fe relative to the sum of Ti, Zr, Fe and Mn is $0.001 \leq z \leq 0.015$,
wherein a molar ratio m of Mn relative to the sum of Ti, Zr, Fe and Mn is $0.0020 \leq m \leq 0.0150$, and
wherein a relationship between y and z is expressed by $0.90 \leq y/z \leq 1.10$.

28. A surface acoustic wave generating device comprising:
the piezoelectric element according to claim 27 so as to generate surface acoustic waves by means of the piezoelectric element.

29. A piezoelectric shutter comprising:
the surface acoustic wave generating device according to claim 28 and a light shielding member,
wherein the piezoelectric shutter is configured to move the light shielding member by driving the surface acoustic wave generating device.

30. An electronic instrument comprising:
an electronic component and the piezoelectric element according to claim 27.

31. An electronic instrument comprising:
an electronic component; and
a piezoelectric element,
wherein the piezoelectric element comprises:
a substrate;
a first electrode;
a piezoelectric film; and
a second electrode;
wherein the piezoelectric film contains oxides of Ba, Bi, Ti, Zr, Fe and Mn,
wherein a molar ratio y of Bi relative to a sum of Ba and Bi is $0.001 \leq y \leq 0.015$,
wherein a molar ratio x of Zr relative to a sum of Ti, Zr, Fe and Mn is $0.010 \leq x \leq 0.060$,
wherein a molar ratio z of Fe relative to the sum of Ti, Zr, Fe and Mn is $0.001 \leq z \leq 0.015$,
wherein a molar ratio m of Mn relative to the sum of Ti, Zr, Fe and Mn is $0.0020 \leq m \leq 0.0150$, and
wherein a relationship between y and z is expressed by $0.90 \leq y/z \leq 1.10$.

* * * * *